(12) United States Patent
Tocalli

(10) Patent No.: US 12,314,598 B2
(45) Date of Patent: May 27, 2025

(54) SOLID STATE STORAGE DEVICE WITH LOOK-UP TABLES PROVIDING IMPROVED REFERENCE VOLTAGES

(71) Applicant: GYLICON LTD, London (GB)

(72) Inventor: Claudio Tocalli, Forcola (IT)

( * ) Notice: Subject to any disclaimer, the term of this patent is extended or adjusted under 35 U.S.C. 154(b) by 0 days.

(21) Appl. No.: 17/191,306

(22) Filed: Mar. 3, 2021

(65) Prior Publication Data

US 2022/0283727 A1 Sep. 8, 2022

(51) Int. Cl.
*G06F 3/06* (2006.01)
(52) U.S. Cl.
CPC .......... *G06F 3/0655* (2013.01); *G06F 3/0604* (2013.01); *G06F 3/064* (2013.01); *G06F 3/0679* (2013.01)
(58) Field of Classification Search
USPC ........................................................ 711/154
See application file for complete search history.

(56) References Cited

U.S. PATENT DOCUMENTS

| | | | | |
|---|---|---|---|---|
| 9,799,405 | B1* | 10/2017 | Micheloni | G11C 16/28 |
| 2012/0239991 | A1* | 9/2012 | Melik-Martirosian | G06F 11/3055 |
| | | | | 711/E12.001 |
| 2015/0143054 | A1* | 5/2015 | Ackaret | G06F 11/0754 |
| | | | | 711/133 |
| 2016/0034206 | A1* | 2/2016 | Ryan | G06F 3/0605 |
| | | | | 711/103 |
| 2017/0109040 | A1* | 4/2017 | Raghu | G06F 3/061 |
| 2018/0033491 | A1* | 2/2018 | Marelli | G11C 16/26 |
| 2018/0226990 | A1* | 8/2018 | Li | G11C 29/52 |
| 2020/0090761 | A1* | 3/2020 | Ando | G11C 16/0483 |
| 2020/0202952 | A1* | 6/2020 | Lee | G11C 16/3495 |
| 2020/0264805 | A1* | 8/2020 | Yoshii | G06F 3/064 |
| 2021/0074366 | A1* | 3/2021 | Horisaki | G11C 29/06 |
| 2021/0211142 | A1* | 7/2021 | Hyodo | H03M 13/6337 |
| 2022/0084605 | A1* | 3/2022 | Muchherla | G06F 3/0604 |
| 2022/0171566 | A1* | 6/2022 | Kim | G06F 3/0619 |

* cited by examiner

*Primary Examiner* — Yaima Rigol
*Assistant Examiner* — Elias Young Kim
(74) *Attorney, Agent, or Firm* — Janeway Patent Law PLLC; John M. Janeway

(57) ABSTRACT

A SSD device comprising a plurality of memory cells programmable and readable at memory page level, and a controller for storing at least one table associated with a memory page. Each table comprises a plurality of table entries each one associated with a range of program/erase cycles and/or a range of retention times, and within each table entry optimal reference voltages indicative of the reference voltages to be used during the read operation of the memory page when the program/erase cycle and/or the retention time of the memory page fall within the range associated with the table entry. During a characterization of the SSD device, the optimal reference voltages are selected, for each range, among first candidate reference voltages indicative of the reference voltages at which the memory page falling within said range is successfully read, and second candidate reference voltages indicative of the reference voltages at which the memory page falling within at least one adjacent range is successfully read.

36 Claims, 10 Drawing Sheets

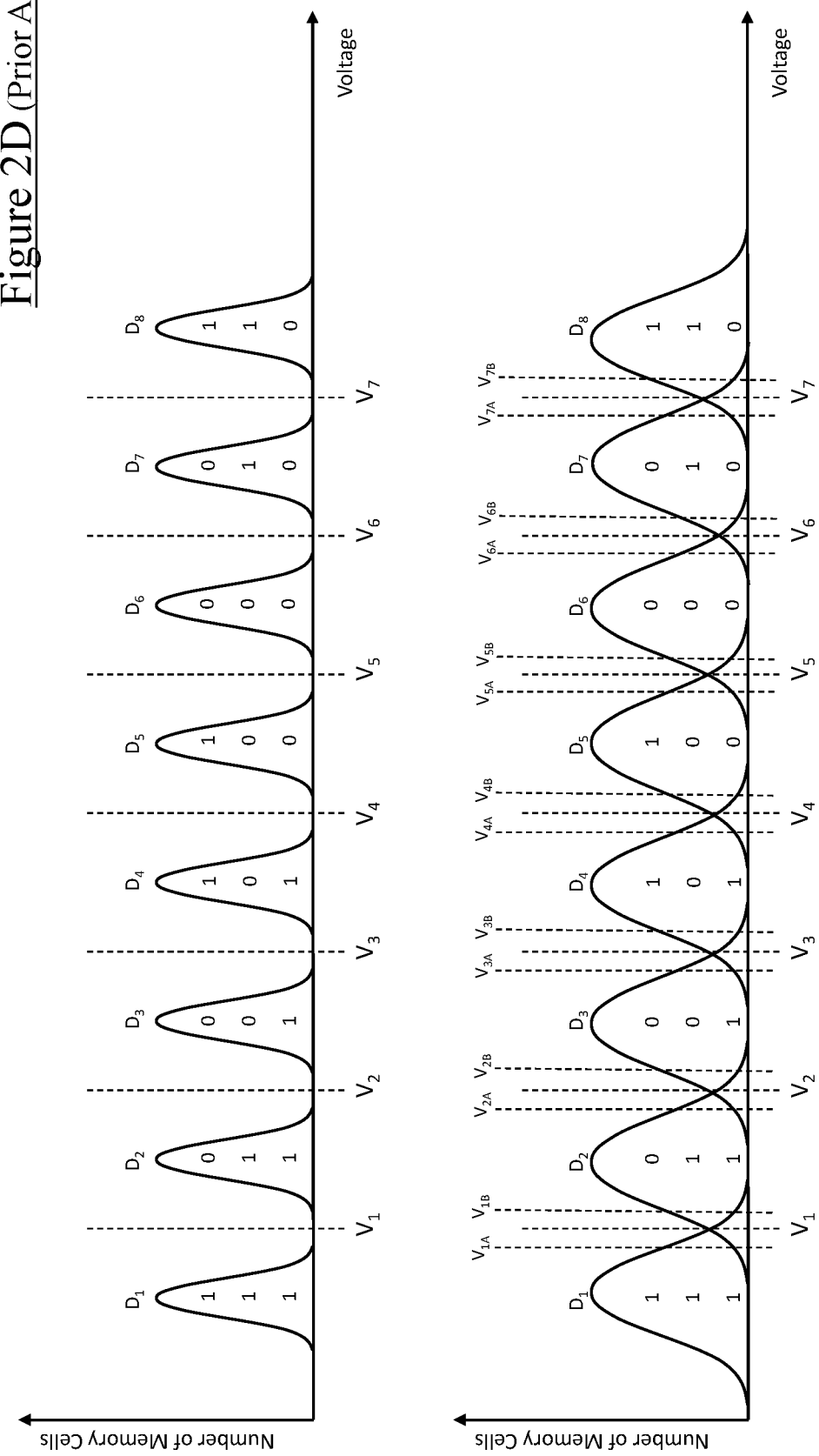

Figure 1A:
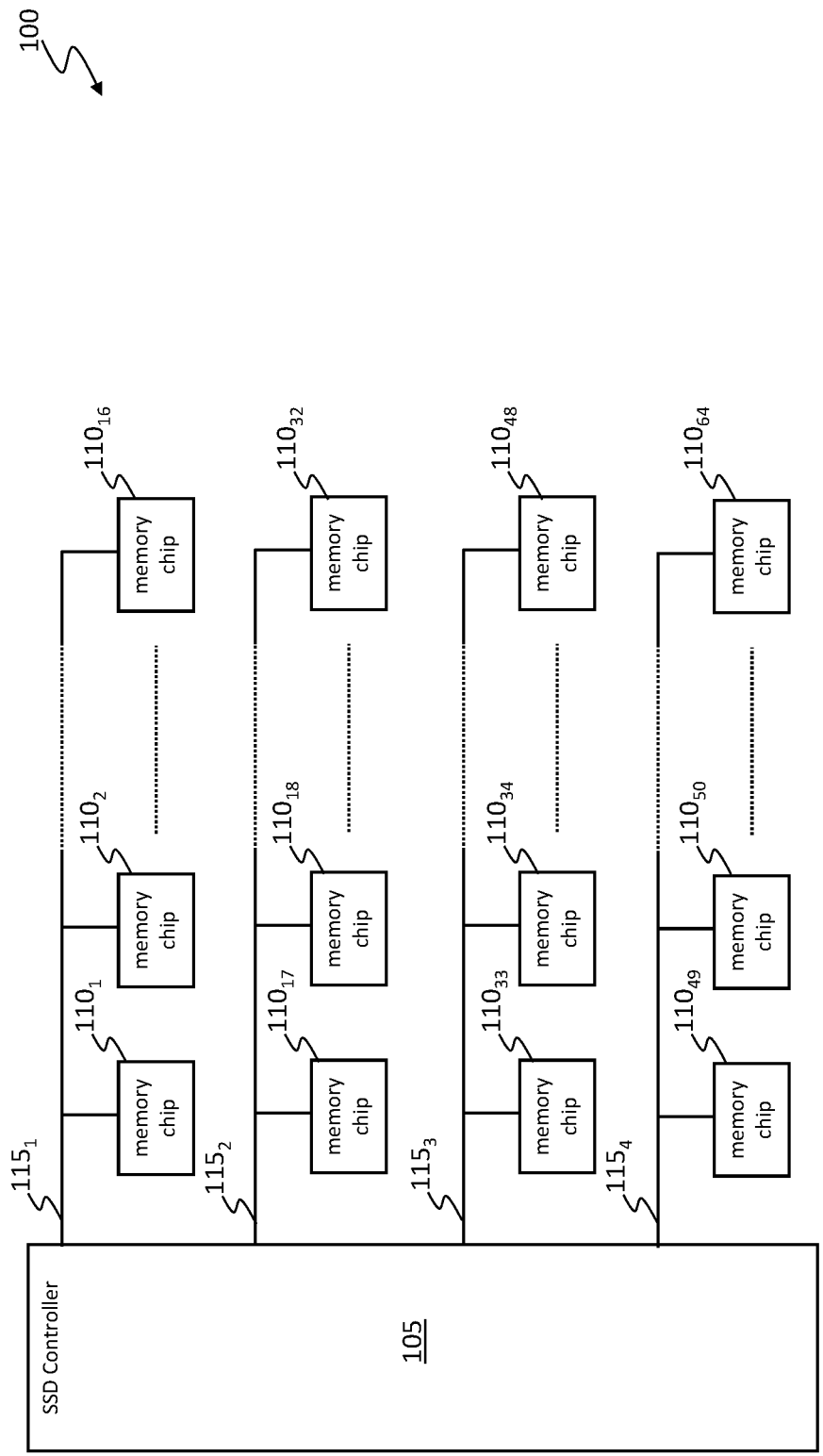

SOLID STATE STORAGE DEVICE WITH LOOK-UP TABLES PROVIDING IMPROVED REFERENCE VOLTAGES

BACKGROUND OF THE INVENTION

Field of the Invention

The present invention generally relates to solid state storage devices, also known as "Solid State Drives" (hereinafter, SSD devices), such as SSD devices provided with non-volatile memory chips (e.g., NAND flash memory chips) for storing data. More particularly, the present invention relates to SSD devices provided with error correction capabilities. Even more particularly, the present invention relates to SSD devices (or controllers thereof) with tables providing improved reference voltages for read operations, and to a corresponding method implemented by such SSD devices.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and an SSD device controller (hereinafter, SSD controller) for managing SSD device operations, such as write/program, erase and read operations.

A common type of memory cell comprises a floating gate transistor: each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing a bit pattern comprising one bit (i.e. two logical states, 0 or 1, defining two threshold voltages), in "Multi-Level Cell" (MLC) technology each memory cell (or MLC memory cell) is capable of storing a bit pattern comprising more than one bit, typically two bits (i.e. four logical states, 00, 01, 10, or 11, defining four threshold voltages), whereas in "Tri-Level Cell" technology each memory cell (or TLC memory cell) is capable of storing a bit pattern comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same bit patterns), practically each threshold voltage associated with a corresponding logical state (or, equivalently, with a corresponding symbol or bit pattern) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a SLC memory cell, in the top drawing of FIG. 2C for a 2-bit MLC memory cell (hereinafter referred to as MLC memory cell for the sake of conciseness) and in the top drawing of FIG. 2D for a TLC memory cell. In such figures the threshold voltage distributions are denoted by $D_j$ (j ranging from 1 to 2 for the SLC memory cell, from 1 to 4 for the MLC memory cell, and from 1 to 8 for the TLC memory cell).

Figure 2A:
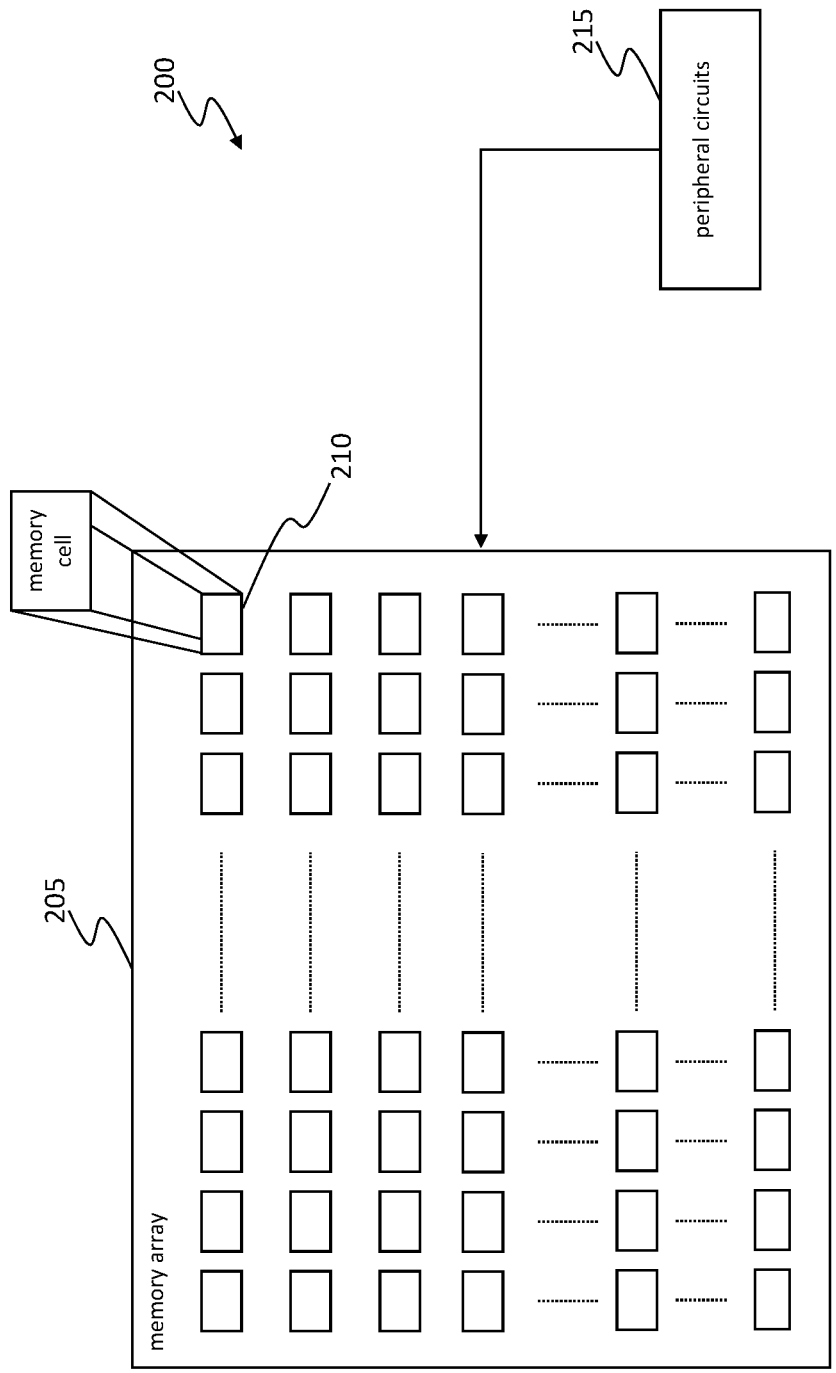
Figure 2B:
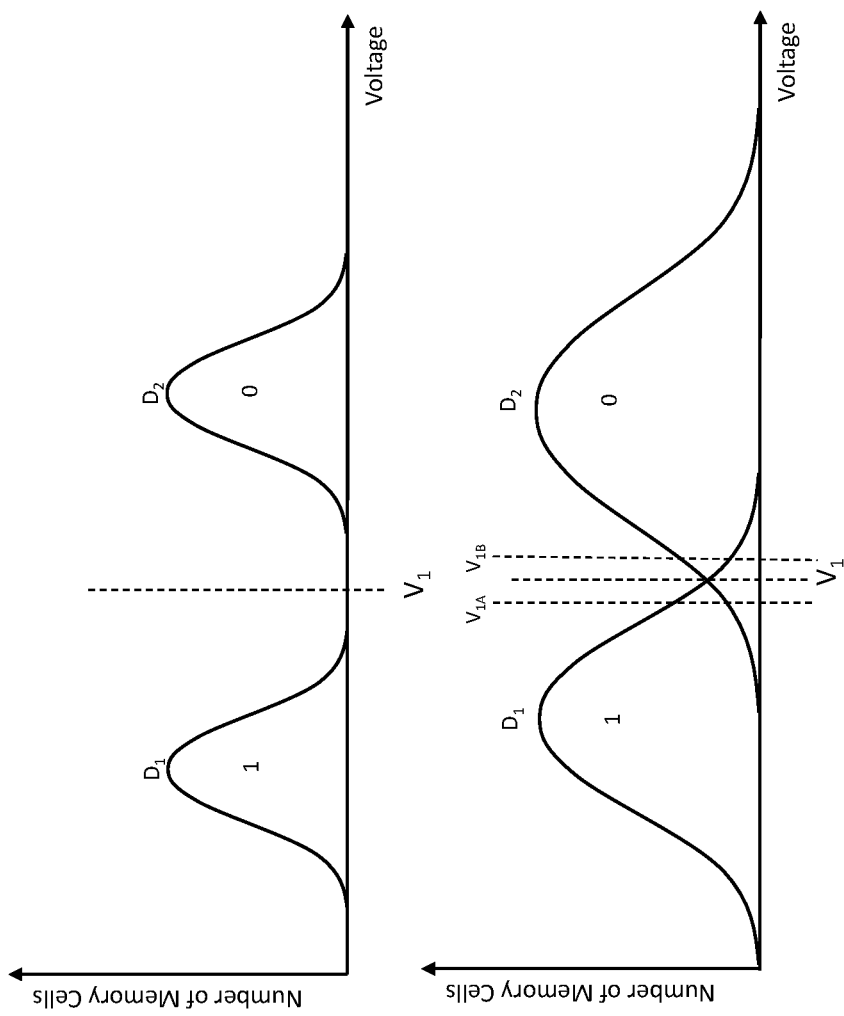
Figure 2C:
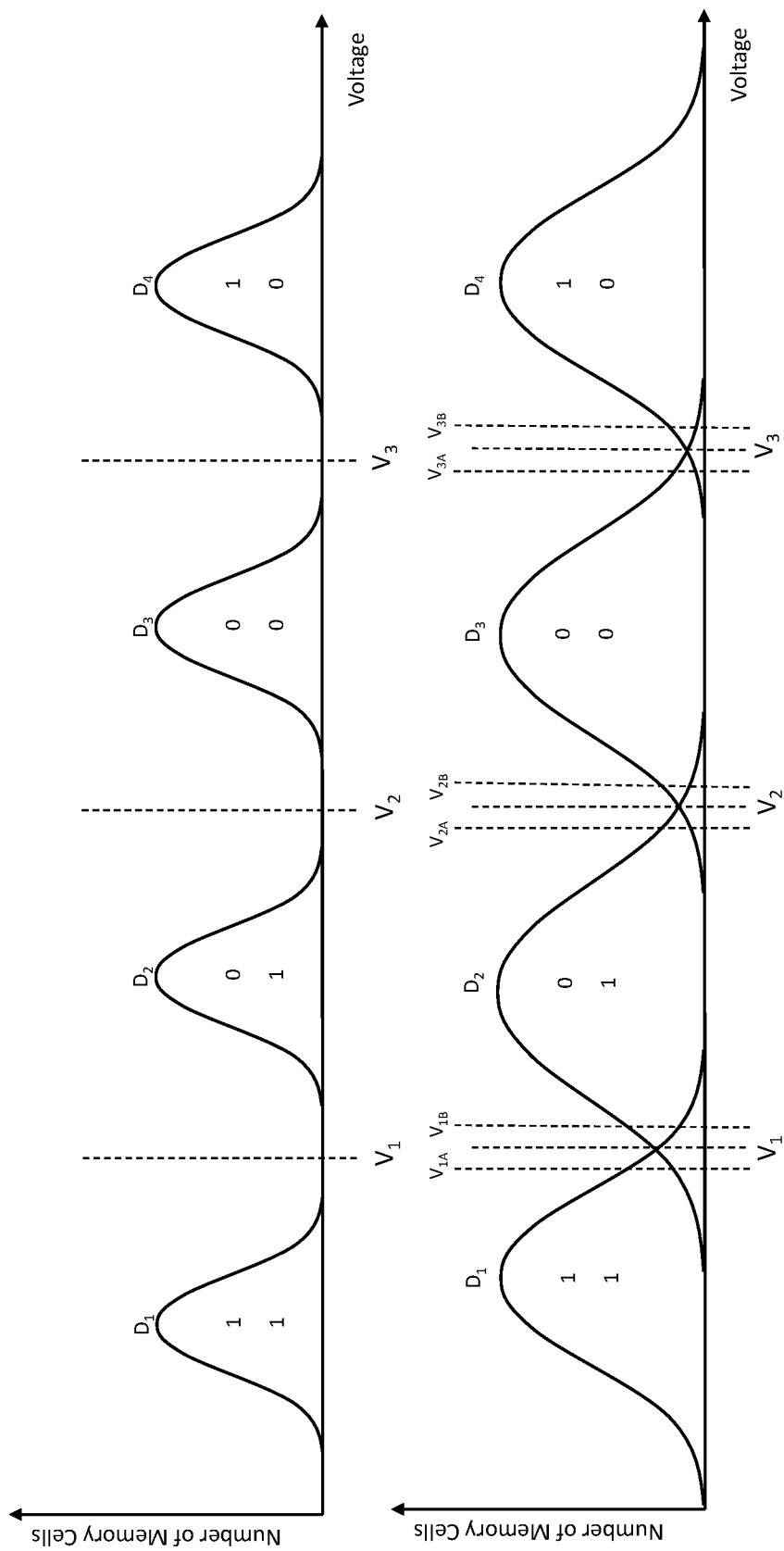

The threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1 in the example of FIG. 2B, k=1, 2, 3 in the example of FIG. 2C and k=1, 2, 3, 4, 5, 6, 7 in the example of FIG. 2C).

In case of the SLC memory cell, during a read operation a threshold voltage below the hard reference voltage $V_1$ represents the bit pattern "1", and a threshold voltage above the hard reference voltage $V_1$ represents the bit pattern "0".

In case of the MLC memory cell, during a read operation a threshold voltage below the hard reference voltage $V_1$ represents the bit pattern "11", a threshold voltage between the hard reference voltages $V_1$ and $V_2$ represents the bit pattern "01", a threshold voltage between the hard reference voltages $V_2$ and $V_3$ represents the bit pattern "00", and a threshold voltage above the hard reference voltage $V_3$ represents the bit pattern "10".

In case of the TLC memory cell and in the exemplary considered coding distributions, during a read operation, a threshold voltage below the hard reference voltage $V_1$ represents the bit pattern "111", a threshold voltage between the hard reference voltages $V_1$ and $V_2$ represents the bit pattern "011", a threshold voltage between the hard reference voltages $V_2$ and $V_3$ represents the bit pattern "001", a threshold voltage between the hard reference voltages $V_3$ and $V_4$ represents the bit pattern "101", a threshold voltage between the hard reference voltages $V_4$ and $V_5$ represents the bit pattern "100", a threshold voltage between the hard reference voltages $V_5$ and $V_6$ represents the bit pattern "000", a threshold voltage between the hard reference voltages $V_6$ and $V_7$ represents the bit pattern "010", and a threshold voltage above the hard reference voltage $V_7$ represents the bit pattern "110".

To read a memory cell, the threshold voltage of the memory cell is compared to the hard reference voltages $V_k$. Typically, reading a memory cell that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention, which translates into partially overlapping areas of adjacent threshold voltage distributions $D_j$ (shown in the bottom drawings of FIGS. 2B, 2C and 2D) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

According to a common implementation, the ECC code allows soft decoding. According to soft decoding, each bit value is determined by means of hard bits (i.e., the read bits resulting from comparisons to the hard reference voltages $V_k$) and of additional information including soft bits and an indication of the reliability of each read (hard and soft) bit—the decoding based on the hard bits being referred to as hard decoding and the decoding based on the hard and soft bits being referred to as soft decoding.

The soft bits mainly arise from multiple read operations. Indeed, when a read operation takes place on the selected memory cells, and the number of bit errors is found to be higher than correction capabilities of the "Forward Error Correction", the selected memory cells are re-read at different values of the reference voltages to attempt to establish the bits in those areas of the threshold voltage distributions $D_j$ wherein bit error is most likely. As visible in the bottom drawings of FIGS. 2B to 2D, such multiple readings are carried out by moving the hard reference voltages $V_k$ in a neighborhood thereof, thus obtaining a number of (for example, two) additional reference voltages (or soft reference voltages) $V_{kA}$-$V_{kB}$ associated with each hard reference voltage $V_k$—the read operations at the soft reference voltages $V_{kA}$-$V_{kB}$ provide the soft bits, and are typically denoted as soft read operations (as opposed to the read operations at the hard reference voltages $V_A$ providing the hard bits, which are typically denoted by hard read operations). By way of example only, each soft reference voltage $V_{kA}$ may be obtained by decreasing the respective hard reference voltage $V_k$ by a 0.125V step, whereas each soft reference voltage $V_{kB}$ may be obtained by increasing the respective hard reference voltage $V_k$ by a 0.125V step.

SUMMARY OF THE INVENTION

The Applicant has recognized that nowadays SSD devices, especially those currently most widespread (i.e., the SSD devices based on MLC and TLC technologies, hereinafter referred to as MLC and TLC SSD devices) are not satisfactory.

According to the Applicant, this is substantially due to the fact that hard decoding has limited error correction capabilities, and to the fact that soft decoding (which actually ensures better error correction capabilities) involves high computational effort (and, hence, high read access times and latency overhead).

Since soft decoding typically takes place after unsuccessful hard decoding, and unsuccessful hard decoding is a relatively frequent occurrence, the criticalities of relying mainly on soft decoding are even more burdensome.

The Applicant has also understood that the limited error correction capabilities of the hard decoding is essentially due to threshold voltage distribution shifting occurring as the SSD device ages, and particularly with the increase of program/erase cycles and/or retention times: this threshold voltage distribution shifting determines an off-centering of each pair of adjacent threshold voltage distributions with respect to the respective hard reference voltages.

The Applicant has tackled the above-discussed issues, and has devised an SSD device storing within it look-up tables (referred to as FRT ("Fixed Read Table") tables) providing optimal hard reference voltages depending on a current aging state (e.g., in terms of program/erase cycles and/or retention times) of the SSD device, and a method implemented by the SSD device that, thanks to the FRT tables, allows improving error correction capabilities of hard decoding (thus limiting soft decoding as much as possible).

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a solid state storage device. The solid state storage device comprises a plurality of programmable memory cells, the memory cells being programmed and read at memory page level, and a controller for storing at least one table associated with a memory page. Each table comprises a plurality of table entries each one associated with at least one range among a range of program/erase cycles and a range of retention times, and, within the table entries, a plurality of optimal reference voltages; the optimal reference voltages within each table entry are indicative of the reference voltages to be used during the read operation of the memory page when the program/erase cycle and/or the retention time of the memory page fall within the range associated with the table entry.

The optimal reference voltages are selected among a plurality of candidate reference voltages resulting from a characterization test of the solid state storage device, the plurality of candidate reference voltages comprising, for each range:
first candidate reference voltages indicative of the reference voltages at which the memory page falling within said range is successfully read during the characterization test, and
second candidate reference voltages indicative of the reference voltages at which the memory page falling within at least one adjacent range being adjacent to said range is successfully read during the characterization test.

According to an embodiment, whose features are additional or alternative to any of the previous embodiments, the plurality of candidate reference voltages comprise a plurality of groups of candidate reference voltages each one associated with a respective adjacency criterion for the at least one adjacent range. The optimal reference voltages are selected among the first and second candidate reference voltages of a number of designated groups of candidate reference voltages being designated among the plurality of groups of candidate reference voltages.

According to an embodiment, whose features are additional or alternative to any of the previous embodiments, the number of designated groups of candidate reference voltages comprise the groups of candidate reference voltages in which, for a predetermined range, the respective first and second candidate reference voltages have resulted, during the characterization test, in a number of read errors lower than a threshold number of read errors.

According to an embodiment, whose features are additional or alternative to any of the previous embodiments, the optimal reference voltages are selected among the first and second candidate reference voltages of an elected one among said number of designated groups of candidate reference voltages. The elected designated group of candidate reference voltages comprises the designated group of candidate reference voltages, among said number of designated groups of candidate reference voltages, in which the percentage of first and second candidate reference voltages having resulted, during the characterization test, in a number of read errors lower than said threshold number of read errors is, for the worst state, the highest.

According to an embodiment, whose features are additional or alternative to any of the previous embodiments, each group of candidate reference voltages is further associated with a respective one of a plurality of test conditions under which the characterization test of the solid state storage device has been performed.

According to an embodiment, whose features are additional or alternative to any of the previous embodiments, the plurality of test conditions comprise a plurality of temperatures.

According to an embodiment, whose features are additional or alternative to any of the previous embodiments, each group of candidate reference voltages is further associated with a respective one of a plurality of selection criteria for selecting the optimal reference voltages among the plurality of candidate reference voltages.

According to an embodiment, whose features are additional or alternative to any of the previous embodiments, the plurality of selection criteria comprise:
  a first selection criterion wherein, for each range, the optimal reference voltage comprises the candidate reference voltage, among the respective first and second candidate reference voltages, whose second-worst number of read errors is the lowest;
  a second selection criterion wherein, for each range, the optimal reference voltage comprises the candidate reference voltage, among the respective first and second candidate reference voltages, whose number of read errors has the lowest median.

According to an embodiment, whose features are additional or alternative to any of the previous embodiments, the at least one table comprises a first and a second tables. The plurality of optimal reference voltages comprised in the first and second tables are indicative of the reference voltages to be used during the read operation of the page of memory cells when a number of read disturb cycles affecting the memory page is above and below, respectively, a threshold number of read disturb cycles.

According to an embodiment, whose features are additional or alternative to any of the previous embodiments, the controller is configured to store a further table associated with the memory page. The further table comprises a plurality of further table entries associated with the at least one range and a plurality of further optimal reference voltages within the further table entries, the further optimal reference voltages within each further table entry being indicative of the reference voltages to be used during the read operation of the memory page when the program/erase cycle and/or the retention time of the memory page fall within said range. The further optimal reference voltages are selected among the first and second candidate reference voltages of a further elected one among said number of designated groups of candidate reference voltages, the further elected designated group of candidate reference voltages comprising the designated group of candidate reference voltages, among said number of designated groups of candidate reference voltages, in which the percentage of first and second candidate reference voltages having resulted, during the characterization test, in a number of read errors lower than said threshold number of read errors, is lower than the highest one.

According to an embodiment, whose features are additional or alternative to any of the previous embodiments, the controller is configured to, after a request of read operation:
  determine a current program/erase cycle and/or a current retention time of the memory page of the solid state storage device;
  identify the at least one range to which the current program/erase cycle and/or the current retention time belong, and
  perform a hard read operation based on the optimal reference voltages within the table entries associated with the identified at least one range.

According to an embodiment, whose features are additional or alternative to any of the previous embodiments, the controller is configured to, after a request of read operation:
  determine a current program/erase cycle and/or a current retention time of the memory page of the solid state storage device;
  identify the at least one range to which the current program/erase cycle and/or the current retention time belong;
  perform a hard read operation based on the optimal reference voltages within the table entries associated with the identified at least one range, and
  in case of unsuccessful hard read operation, perform a hard read operation based on the further optimal reference voltages within the table entries associated with the identified at least one range.

Another aspect of the present invention relates to a controller for a solid state storage device. The solid state storage device comprises a plurality of programmable memory cells, the memory cells being programmed and read at memory page level. The controller is configured to store at least one table associated with a memory page. Each table comprises a plurality of table entries each one associated with at least one range among a range of program/erase cycles and a range of retention times, and, within the table entries, a plurality of optimal reference voltages. The optimal reference voltages within each table entry are indicative of the reference voltages to be used during the read operation of the memory page when the program/erase cycle and/or the retention time of the memory page fall within the range associated with the table entry.

The optimal reference voltages are selected among a plurality of candidate reference voltages resulting from a characterization test of the solid state storage device, the plurality of candidate reference voltages comprising, for each range:
  first candidate reference voltages indicative of the reference voltages at which the memory page falling within said range is successfully read during the characterization test, and
  second candidate reference voltages indicative of the reference voltages at which the memory page falling within at least one adjacent range being adjacent to said range is successfully read during the characterization test.

According to an embodiment, whose features are additional or alternative to any of the previous embodiments, the plurality of candidate reference voltages comprise a plurality of groups of candidate reference voltages each one associated with a respective adjacency criterion for the at least one adjacent range. The optimal reference voltages are selected among the first and second candidate reference voltages of a number of designated groups of candidate reference voltages being designated among the plurality of groups of candidate reference voltages.

According to an embodiment, whose features are additional or alternative to any of the previous embodiments, the number of designated groups of candidate reference voltages comprise the groups of candidate reference voltages in which, for a predetermined range, the respective first and second candidate reference voltages have resulted, during the characterization test, in a number of read errors lower than a threshold number of read errors.

According to an embodiment, whose features are additional or alternative to any of the previous embodiments, the optimal reference voltages are selected among the first and second candidate reference voltages of an elected one among said number of designated groups of candidate reference voltages. The elected designated group of candidate reference voltages comprises the designated group of candidate reference voltages, among said number of designated groups of candidate reference voltages, in which the percentage of first and second candidate reference voltages having resulted, during the characterization test, in a number of read errors lower than said threshold number of read errors is, for the worst state, the highest.

According to an embodiment, whose features are additional or alternative to any of the previous embodiments, each group of candidate reference voltages is further associated with a respective one of a plurality of test conditions under which the characterization test of the solid state storage device has been performed.

According to an embodiment, whose features are additional or alternative to any of the previous embodiments, the plurality of test conditions comprise a plurality of temperatures.

According to an embodiment, whose features are additional or alternative to any of the previous embodiments, each group of candidate reference voltages is further associated with a respective one of a plurality of selection criteria for selecting the optimal reference voltages among the plurality of candidate reference voltages.

According to an embodiment, whose features are additional or alternative to any of the previous embodiments, the plurality of selection criteria comprise:
  a first selection criterion wherein, for each range, the optimal reference voltage comprises the candidate reference voltage, among the respective first and second candidate reference voltages, whose second-worst number of read errors is the lowest;
  a second selection criterion wherein, for each range, the optimal reference voltage comprises the candidate reference voltage, among the respective first and second candidate reference voltages, whose number of read errors has the lowest median.

According to an embodiment, whose features are additional or alternative to any of the previous embodiments, the at least one table comprises a first and a second tables. The plurality of optimal reference voltages comprised in the first and second tables are indicative of the reference voltages to be used during the read operation of the page of memory cells when a number of read disturb cycles affecting the memory page is above and below, respectively, a threshold number of read disturb cycles.

According to an embodiment, whose features are additional or alternative to any of the previous embodiments, the controller is configured to store a further table associated with the memory page. The further table comprises a plurality of further table entries associated with the at least one range and a plurality of further optimal reference voltages within the further table entries. The further optimal reference voltages within each further table entry are indicative of the reference voltages to be used during the read operation of the memory page when the program/erase cycle and/or the retention time of the memory page fall within said range. The further optimal reference voltages are selected among the first and second candidate reference voltages of a further elected one among said number of designated groups of candidate reference voltages, the further elected designated group of candidate reference voltages comprising the designated group of candidate reference voltages, among said number of designated groups of candidate reference voltages, in which the percentage of first and second candidate reference voltages having resulted, during the characterization test, in a number of read errors lower than said threshold number of read errors, is lower than the highest one.

According to an embodiment, whose features are additional or alternative to any of the previous embodiments, the controller is configured to, after a request of read operation:
  determine a current program/erase cycle and/or a current retention time of the memory page of the solid state storage device;
  identify the at least one range to which the current program/erase cycle and/or the current retention time belong, and
  perform a hard read operation based on the optimal reference voltages within the table entries associated with the identified at least one range.

According to an embodiment, whose features are additional or alternative to any of the previous embodiments, the controller is configured to, after a request of read operation:
  determine a current program/erase cycle and/or a current retention time of the memory page of the solid state storage device;
  identify the at least one range to which the current program/erase cycle and/or the current retention time belong;
  perform a hard read operation based on the optimal reference voltages within the table entries associated with the identified at least one range, and
  in case of unsuccessful hard read operation, perform a hard read operation based on the further optimal reference voltages within the table entries associated with the identified at least one range.

Another aspect of the present invention relates to a method for operating a solid state storage device comprising a plurality of programmable memory cells, the memory cells being programmed and read at memory page level. The method comprises storing at least one table associated with a memory page. Each table comprises a plurality of table entries each one associated with at least one range among a range of program/erase cycles and a range of retention times, and, within the table entries, a plurality of optimal reference voltages. The optimal reference voltages within each table entry are indicative of the reference voltages to be used during the read operation of the memory page when the program/erase cycle and/or the retention time of the memory page fall within the range associated with the table entry.

The method further comprises selecting the optimal reference voltages among a plurality of candidate reference voltages resulting from a characterization test of the solid state storage device, the plurality of candidate reference voltages comprising, for each range:
  first candidate reference voltages indicative of the reference voltages at which the memory page falling within said range is successfully read during the characterization test, and
  second candidate reference voltages indicative of the reference voltages at which the memory page falling within at least one adjacent range being adjacent to said range is successfully read during the characterization test.

According to an embodiment, whose features are additional or alternative to any of the previous embodiments, the plurality of candidate reference voltages comprise a plurality of groups of candidate reference voltages each one associated with a respective adjacency criterion for the at least one adjacent range. The method comprises:
  designating a number of groups of candidate reference voltages among the plurality of groups of candidate reference voltages, and
  selecting the optimal reference voltages among the first and second candidate reference voltages of said number of designated groups of candidate reference voltages.

According to an embodiment, whose features are additional or alternative to any of the previous embodiments, the number of designated groups of candidate reference voltages comprise the groups of candidate reference voltages in which, for a predetermined range, the respective first and second candidate reference voltages have resulted, during the characterization test, in a number of read errors lower than a threshold number of read errors.

According to an embodiment, whose features are additional or alternative to any of the previous embodiments, the method comprises:
  electing a designated group of candidate reference voltages as the designated group of candidate reference voltages, among said number of designated groups of candidate reference voltages, in which the percentage of first and second candidate reference voltages having resulted, during the characterization test, in a number of read errors lower than said threshold number of read errors is, for the worst state, the highest, and
  selecting the optimal reference voltages among the first and second candidate reference voltages of the elected designated group of candidate reference voltages.

According to an embodiment, whose features are additional or alternative to any of the previous embodiments, each group of candidate reference voltages is further associated with a respective one of a plurality of test conditions under which the characterization test of the solid state storage device has been performed.

According to an embodiment, whose features are additional or alternative to any of the previous embodiments, the plurality of test conditions comprise a plurality of temperatures.

According to an embodiment, whose features are additional or alternative to any of the previous embodiments, each group of candidate reference voltages is further associated with a respective one of a plurality of selection criteria for selecting the optimal reference voltages among the plurality of candidate reference voltages.

According to an embodiment, whose features are additional or alternative to any of the previous embodiments, the plurality of selection criteria comprise:
  a first selection criterion wherein, for each range, the optimal reference voltage comprises the candidate reference voltage, among the respective first and second candidate reference voltages, whose second-worst number of read errors is the lowest;
  a second selection criterion wherein, for each range, the optimal reference voltage comprises the candidate reference voltage, among the respective first and second candidate reference voltages, whose number of read errors has the lowest median.

According to an embodiment, whose features are additional or alternative to any of the previous embodiments, the at least one table comprises a first and a second tables. The plurality of optimal reference voltages comprised in the first and second tables are indicative of the reference voltages to be used during the read operation of the page of memory cells when a number of read disturb cycles affecting the memory page is above and below, respectively, a threshold number of read disturb cycles.

According to an embodiment, whose features are additional or alternative to any of the previous embodiments, the method comprises storing a further table associated with the memory page. The further table comprises a plurality of further table entries associated with the at least one range and a plurality of further optimal reference voltages within the further table entries. The further optimal reference voltages within each further table entry are indicative of the reference voltages to be used during the read operation of the memory page when the program/erase cycle and/or the retention time of the memory page fall within said range. The method comprises:
  electing a further designated group of candidate reference voltages as the designated group of candidate reference voltages, among said number of designated groups of candidate reference voltages, in which the percentage of first and second candidate reference voltages having resulted, during the characterization test, in a number of read errors lower than said threshold number of read errors, is lower than the highest one, and
  selecting the further optimal reference voltages among the first and second candidate reference voltages of the further elected designated group of candidate reference voltages.

According to an embodiment, whose features are additional or alternative to any of the previous embodiments, the method comprises, after a request of read operation:
  determining a current program/erase cycle and/or a current retention time of the memory page of the solid state storage device;
  identifying the at least one range to which the current program/erase cycle and/or the current retention time belong, and
  performing a hard read operation based on the optimal reference voltages within the table entries associated with the identified at least one range.

According to an embodiment, whose features are additional or alternative to any of the previous embodiments, the method comprises, after a request of read operation:
  determining a current program/erase cycle and/or a current retention time of the memory page of the solid state storage device;
  identifying the at least one range to which the current program/erase cycle and/or the current retention time belong;
  performing a hard read operation based on the optimal reference voltages within the table entries associated with the identified at least one range, and
  in case of unsuccessful hard read operation, performing a hard read operation based on the further optimal reference voltages within the table entries associated with the identified at least one range.

BRIEF DESCRIPTION OF THE ANNEXED DRAWINGS

Figure 1B:
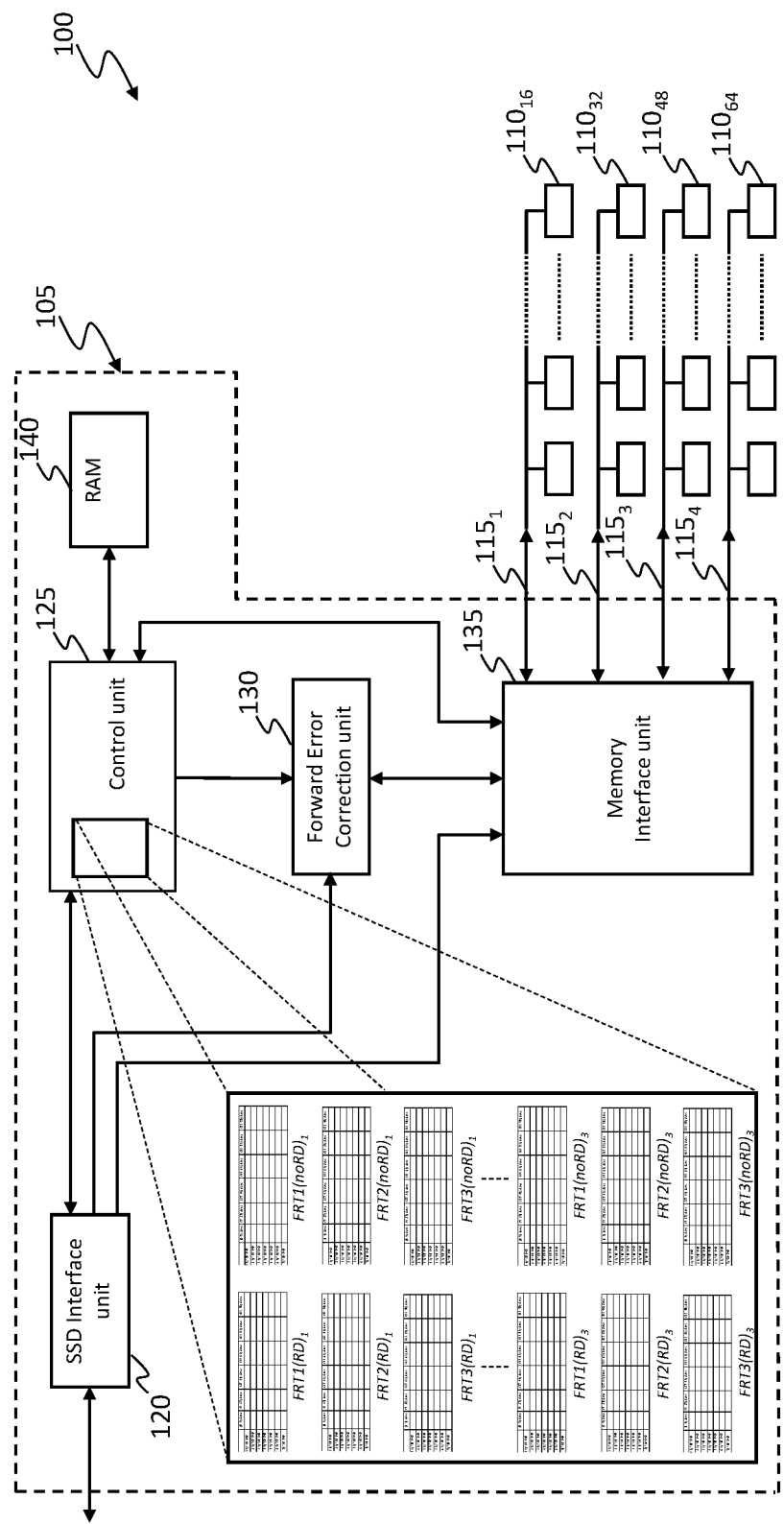
Figure 3:
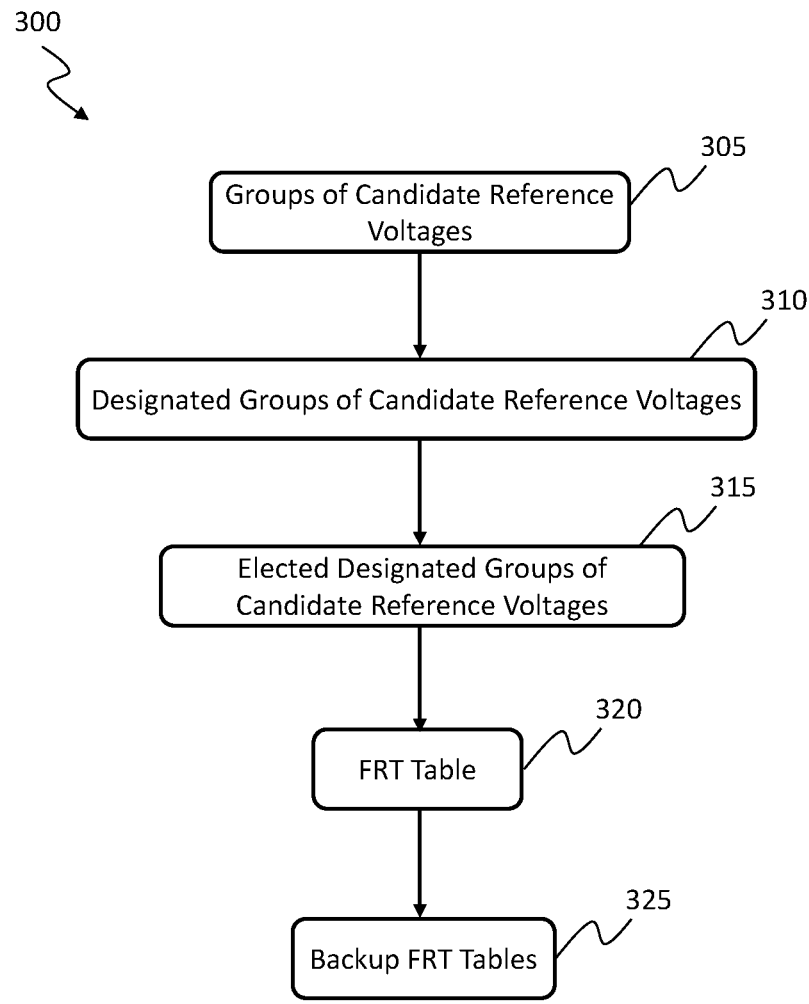
Figure 4:
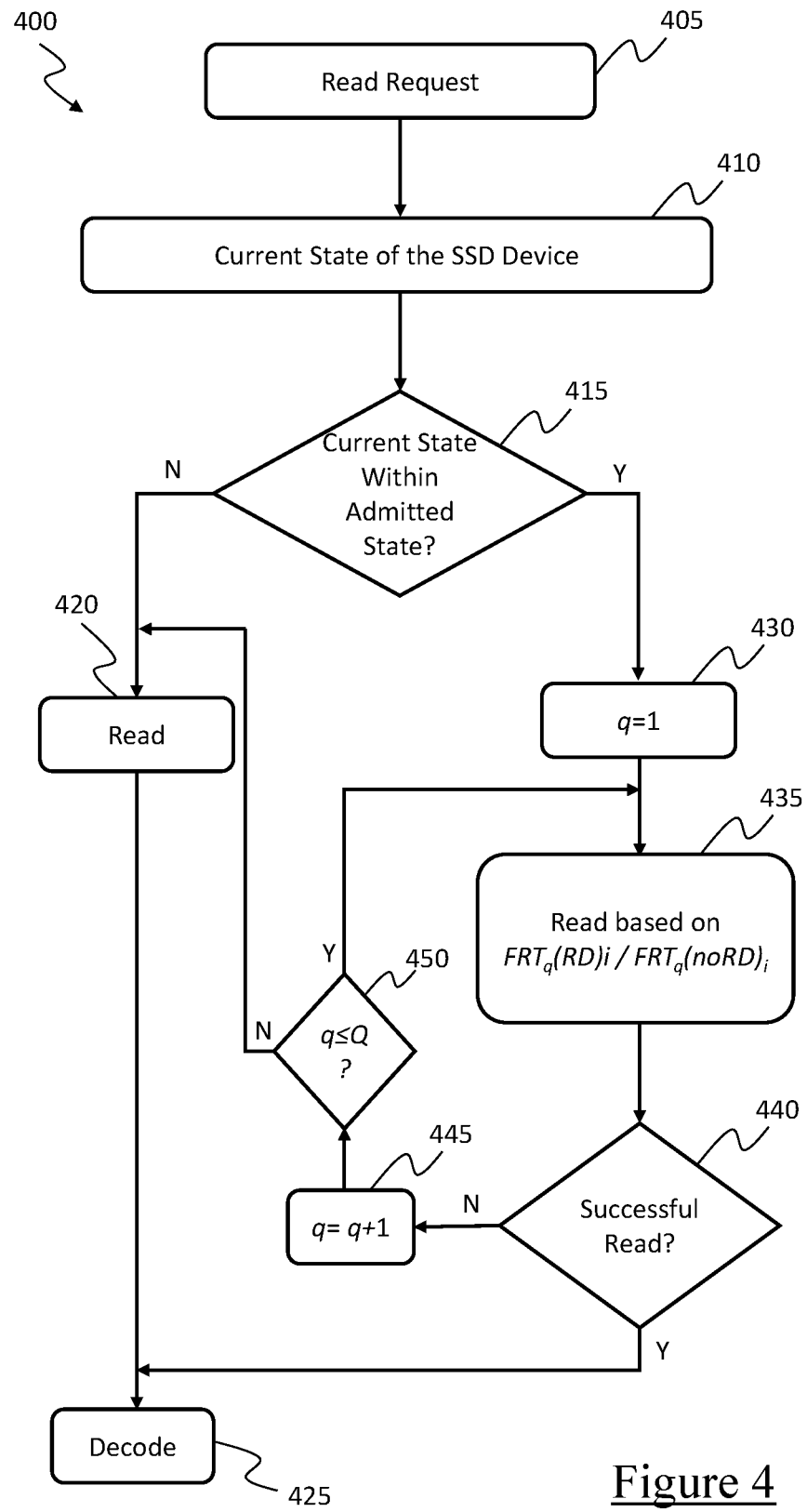
Figure 5A:
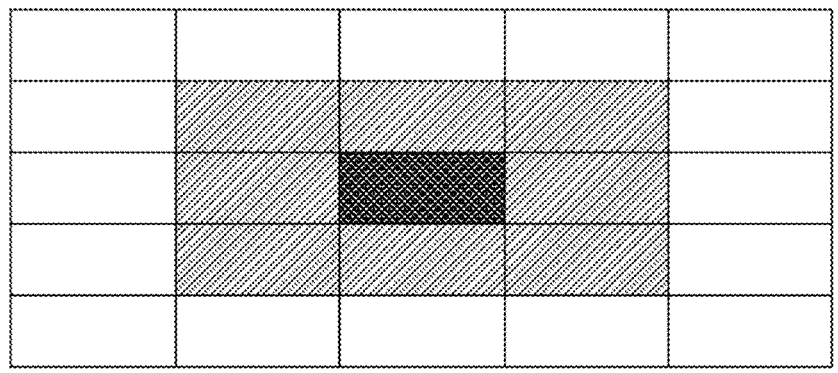
Figure 5B:
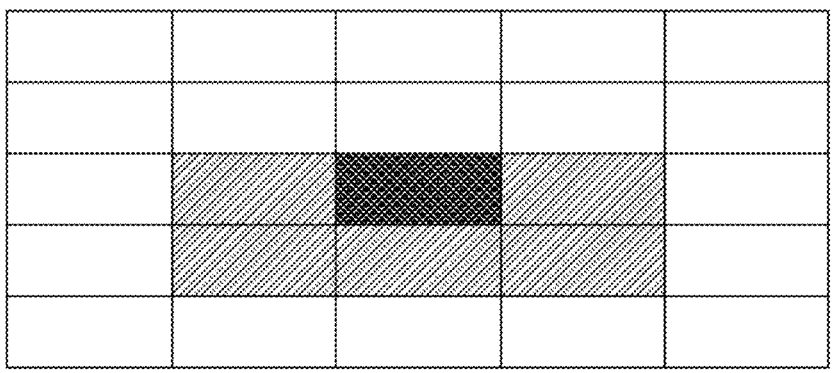
Figure 5C:
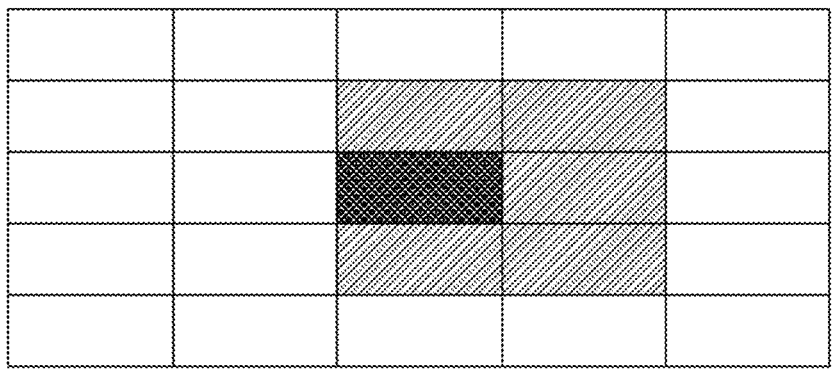
Figure 5D:
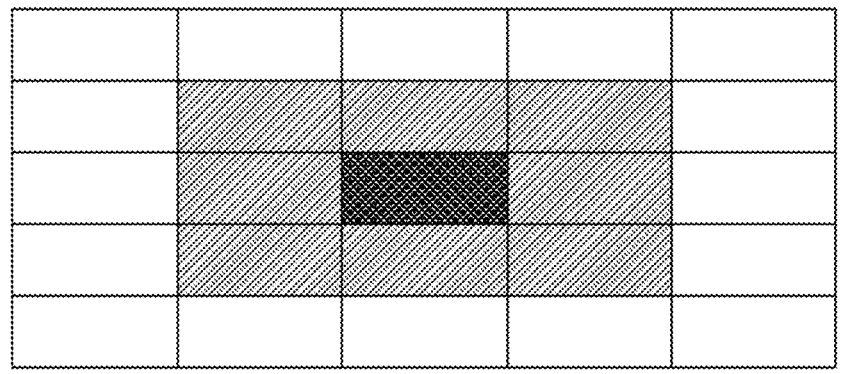
Figure 5E:
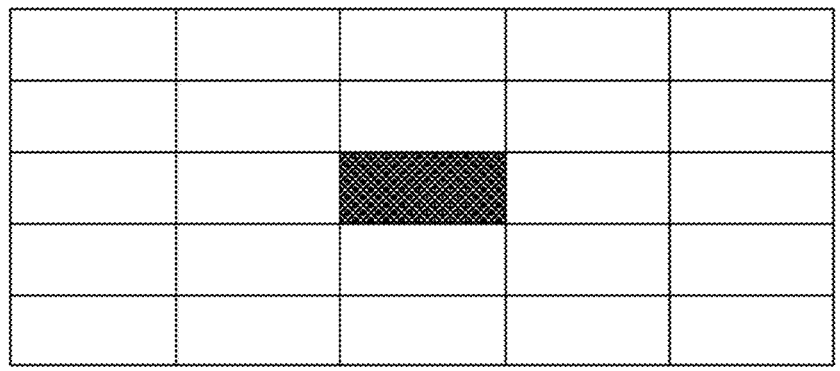

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of an SSD device according to embodiments of the present invention;

FIG. 1B schematically shows a simplified architecture of an SSD controller of said SSD device according to embodiments of the present invention;

FIG. 2A schematically shows an exemplary architecture of a flash memory die of said SSD device according to embodiments of the present invention;

FIGS. 2B to 2D schematically show exemplary ideal and real threshold voltage distributions of SLC memory cells, of MLC memory cells and of TLC memory cells, respectively, of said flash memory die;

FIG. 3 shown an activity diagram of a procedure for designing FRT tables stored in the SSD controller according to embodiments of the present invention, and FIG. 4 schematically shows an activity diagram of a decoding procedure carried out by the SSD controller according to embodiments of the present invention.

FIGS. 5A to 5E show exemplary adjacency criteria according to embodiments of the present invention.

DETAILED DESCRIPTION OF PREFERRED EMBODIMENTS OF THE INVENTION

With reference to the drawings, FIG. 1A schematically shows a simplified architecture of an SSD ("Solid State Drive") device 100 according to embodiments of the present invention.

The SSD device 100 comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, . . . , I, with I=64 in the example at issue), and a plurality of (e.g., synchronous and/or asynchronous) channels $115_j$ (j=1, 2, 3, . . . , J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows a simplified architecture of the SSD controller 105 according to embodiments of the present invention.

In the following, when one or more features of the SSD controller 105 (as well as of a method implemented by it) are introduced by the wording "according to an embodiment", they are to be construed as features additional or alternative to any features previously introduced, unless otherwise indicated and/or unless there is evident incompatibility among feature combinations that is immediately apparent to the person skilled in the art.

The simplified architecture of the SSD controller 105 is shown in FIG. 1B in terms of operating units. The term "unit" is herein intended to emphasize functional (rather than implementation) aspects thereof; each unit may for example include hardware or circuitry with processing and/or storing capabilities.

For the sake of completeness, FIG. 1B also shows, with a smaller size, the memory chips $110_i$ and the channels $115_j$ (only some of the memory chips being numbered in such a figure for ease of illustration).

According to an embodiment, the SSD controller 105 comprises an SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 may be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by means of bi-directional arrow connections between the units.

According to an embodiment, the SSD controller 105 comprises a control unit 125 (or more thereof) for managing SSD device 100 operation, such as for receiving and processing the user commands from the SSD interface unit 120, handling bit transport to/from the memory chips $110_i$ along the channels $115_j$ and bit transport to/from the SSD interface unit 120, and coordinating enabling and/or disabling of the memory chips $110_i$ according to the user commands. For the purposes of the present disclosure, the SSD controller 105 stores within it (e.g., within the control unit 125) a plurality of lookup tables (hereinafter, FRT tables) aimed at compensating for decreasing performance affecting the SSD device 100 with its use (as better discussed in the following).

According to an embodiment, the SSD controller 105 comprises a "Forward Error Correction" (FEC) unit 130 for locating and correcting bit errors, so as to compensate for large "Raw Bit Error Rate" (RBER) and to increase reliability of the SSD device 100.

According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

According to an embodiment, the SSD controller 105 comprises a memory interface unit 135 for allowing bit transport between the SSD controller 105 and the memory chips $110_i$ along the respective channels $115_j$. According to alternative embodiments, the SSD controller 105 may comprise a plurality (i.e., two or more) memory interface units: for example, the SSD controller 105 may comprise a memory interface unit for each channel $115_j$, or a memory interface unit 135 for each memory chip $110_i$ (or for each group of memory chips $110_i$).

As conceptually depicted in the figure by means of a unidirectional arrow connection, the memory interface unit 135 may be communicably coupled in a unidirectional manner to the SSD interface 120 (e.g., for receiving from it the information bits to be written when no ECC code is requested).

As conceptually depicted in the figure by means of a bi-directional arrow connection, the memory interface unit 135 may be communicably coupled in a bi-directional manner to the control unit 125 (e.g., for receiving control information from it, such as an indication of the memory chips $110_i$ to be enabled for write or read operations, and for providing to it the read bits to be transmitted to the SSD interface unit 120).

As conceptually depicted in the figure by means of a bi-directional arrow connection, the memory interface unit 135 may be communicably coupled in a bi-directional manner to the FEC unit 130 (for example, for receiving encoded bits from it, e.g. including the information and parity bits, and for providing to it the read bits to be decoded before transmitting to the control unit 125, and hence to the SSD interface unit 120, the read information bits).

According to an embodiment, the SSD controller 105 comprises a memory unit (e.g., a "Random Access Memory", RAM) 140 communicably coupled (e.g., in a bi-directional manner) to the control unit 125 for receiving and storing statistical information (such as number of program/erase cycles, number of bit errors, retention times) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

According to an embodiment, each flash memory chip $110_i$ comprises one or more flash memory dice.

An exemplary architecture of a flash memory die of the SSD device 100 is schematically illustrated in FIG. 2A and denoted by the number reference 200.

The flash memory die 200 comprises one (as depicted) or more memory arrays 205 of memory cells (e.g., NAND flash memory cells) 210 arranged in rows and columns.

Each memory array 205 is divided into multiple memory pages. Broadly speaking, each memory page comprises a number of memory cells 210 that can be programmed and read simultaneously (otherwise stated, the memory cells may be programmed and read at memory page level). A number of memory pages form a memory block, and the size of the memory block equals to the product of the size of the memory page and the total number of memory pages in the memory block.

The memory die 200 comprises peripheral circuits 215 (such as decoders, multiplexers, drivers, buffers, sense amplifiers), which are represented in the figure by means of a single functional block. Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

Each memory cell 210 is programmable to store a bit or group of bits (or symbol, or bit pattern) among a plurality of bit patterns, wherein each bit pattern identifies or is associated with a respective logical state of the memory cell 210.

Each memory cell 210 may for example comprise a floating gate transistor (not illustrated). Each bit pattern identifying a respective logical state of the memory cell 210 is physically stored in each memory cell 210 in the form of electric charge in the floating gate, which defines a corresponding threshold voltage of the transistor.

The number of bits each memory cell 210 is capable of storing depends on memory cell technology. For example, in "Single-Level Cell" (SLC) technology each memory cell (or SLC memory cell) is capable of storing a bit pattern comprising one bit (i.e. two logical states, 0 or 1, defining, i.e. being associated with, two threshold voltages), in "Multi-Level Cell" (MLC) technology each memory cell (or MLC memory cell) is capable of storing a bit pattern comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing a bit pattern comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature and be associated with same (nominal) threshold voltages for same logical states (or, equivalently, for same symbols), practically each threshold voltage associated with a corresponding logical state (or, equivalently, associated with a corresponding bit pattern) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take; otherwise stated, memory cells programmed to store a same bit pattern among the plurality of bit patterns exhibit actual threshold voltages that are variable over the memory cells 210 around the corresponding nominal threshold voltage thereby defining a respective threshold voltage distribution $D_j$ associated with that same bit pattern. This is schematically shown in the top drawing of FIG. 2B for a SLC memory cell, in the top drawing of FIG. 2C for a MLC memory cell, and in the top drawing of FIG. 2D for a TLC memory cell.

As discussed in the introductory part of this disclosure, the threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1 in the example of FIG. 2B, k=1, 2, 3 in the example of FIG. 2C, and k=1, 2, 3, 4, 5, 6, 7 in the example of FIG. 2D). Therefore, each pair of adjacent bit patterns, which are associated with a corresponding adjacent pair of nominal threshold voltages (and hence with a corresponding adjacent pair of threshold voltage distributions $D_j$), may be discriminated, during a read operation, by a respective hard reference voltage $V_k$ which is between the corresponding adjacent nominal threshold voltages.

In the case of SLC memory cell, during a read operation, a threshold voltage below the single hard reference voltage $V_1$ represents the bit pattern "1", and a threshold voltage above the hard reference voltage $V_1$ represents the bit pattern "0".

In the case of MLC memory cell, during a read operation, a threshold voltage below the hard reference voltage $V_1$ represents the bit pattern "11", a threshold voltage between the hard reference voltages $V_1$ and $V_2$ represents the bit pattern "01", a threshold voltage between the hard reference voltages $V_2$ and $V_3$ represents the bit pattern "00", and a threshold voltage above the hard reference voltage $V_3$ represents the bit pattern "10".

In the case of TLC memory cell, and in the exemplary considered coding distributions, during a read operation, a threshold voltage below the hard reference voltage $V_1$ represents the bit pattern "111", a threshold voltage between the hard reference voltages $V_1$ and $V_2$ represents the bit pattern "011", a threshold voltage between the hard reference voltages $V_2$ and $V_3$ represents the bit pattern "001", a threshold voltage between the hard reference voltages $V_3$ and $V_4$ represents the bit pattern "101", a threshold voltage between the hard reference voltages $V_4$ and $V_5$ represents the bit pattern "100", a threshold voltage between the hard reference voltages $V_5$ and $V_6$ represents the bit pattern "000", a threshold voltage between the hard reference voltages $V_6$ and $V_7$ represents the bit pattern "010", and a threshold voltage above the hard reference voltage $V_7$ represents the bit pattern "110".

To read a memory cell 210, the threshold voltage of the memory cell 210 is compared to the hard reference voltages $V_k$. According to a common implementation, reading a memory cell 210 that stores a bit pattern of m bits requires, for one or more memory pages, m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

The two bits stored in an MLC memory cell are usually referred to as "Least Significant Bit" (LSB bit) and "Most Significant Bit" (MSB bit). With reference to the conceptual representation of vertically arranged bit pattern associated with the respective threshold voltage distribution $D_j$, the LSB and MSB bits are assumed to be the bottom and top bits, respectively.

The three bits stored in a TLC memory cell are usually referred to as "Least Significant Bit" (LSB bit), "Center Significant Bit" (CSB bit) and "Most Significant Bit" (MSB bit). With reference to the conceptual representation of vertically arranged bit pattern associated with the respective threshold voltage distribution $D_j$, the LSB, CSB and MSB bits are assumed to be the bottom, central and top bits, respectively.

However, the terms LSB, CSB and MSB are used only as a reference to specific bits within the memory cell, and do not imply that certain bits are more important than others (in this respect, any other suitable terminology may also be used).

According to a common implementation, which will be assumed to be the implementation of the SSD device 100, different bits in a given group of memory cells 210 correspond to different memory pages.

For example, a group of TLC memory cells 210 may be used for storing three memory pages, such as a first memory page (LSB page) comprising the LSB bits of the group of TLC memory cells, a second memory page (CSB page) comprising the CSB bits of the group of TLC memory cells, and a third memory page (MSB page) comprising the MSB bits of the group of TLC memory cells. Similarly, a group of MLC memory cells may be used for storing LSB and MSB pages.

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B, 2C and 2D) and, hence, into increasing of the probability of the number of bit errors per unit time (i.e., the RBER).

According to an embodiment, the ECC code implemented in the FEC unit 130 may be an ECC code allowing soft decoding—or, otherwise stated, an ECC code that allows determining each bit value by means of hard bits (i.e., the read bits resulting from comparisons to the hard reference voltages $V_k$) and of additional information including soft bits and an indication of the reliability of each read (hard and soft) bit typically evaluated or estimated according to RBER—the decoding based on the hard bits being referred to as hard decoding and the decoding based on the hard and soft bits being referred to as soft decoding.

The soft bits mainly arise from multiple read operations. Indeed, when a read operation takes place on the selected memory cells, and the number of bit errors is found to be higher than correction capabilities of the "Forward Error Correction", the SSD controller 105 may be configured to reread the selected memory cells at different values of the reference voltages to attempt to establish the bits in those areas of the threshold voltage distributions $D_j$ wherein bit error is most likely. As visible in the bottom drawings of FIGS. 2B to 2C, such multiple readings are carried out by moving the hard reference voltages $V_k$ in a neighborhood thereof, thus obtaining a number of (for example, two) additional reference voltages (or soft reference voltages) $V_{kA}$–$V_{kB}$ associated with each hard reference voltage $V_k$— the read operations at the soft reference voltages $V_{kA}$–$V_{kB}$ provide the soft bits, and are typically denoted as soft read operations (as opposed to the read operations at the hard reference voltages $V_k$ providing the hard bits, which are typically denoted by hard read operations). By way of example only, each soft reference voltage $V_{kA}$ may be obtained by decreasing the respective hard reference voltage $V_k$ by a 0.125V step, whereas each soft reference voltage $V_{kB}$ may be obtained by increasing the respective hard reference voltage $V_k$ by a 0.125V step.

The Applicant has found that, during SSD device lifetime, error correction techniques (including the most burdensome ones, such as those based on soft read operations and subsequent soft decoding) may not be able to recover all the error patterns, especially when the SSD device ages, and particularly with the increase of program/erase cycles and/or retention times.

In order to compensate for decreasing performance affecting the SSD device with its use, according to the principles of the present invention the SSD controller 105 is configured to store one or more tables (FRT tables) associated with each memory page.

According to an embodiment, the SSD controller 105 is configured to store one FRT table associated with each memory page.

The FRT table comprises a plurality of table entries (or cells) each one associated with one or more ranges of program/erase cycles and/or one or more ranges of retention times, and within the table entries, a plurality of optimal reference voltages: as better discussed in the following, the optimal reference voltages within each table entry are indicative of the hard reference voltages to be used for read operations, and particularly during the read operations of the memory page when the program/erase cycle and/or the retention time of the memory page fall within the range associated with the table entry.

In the exemplary considered embodiment, each table entry of the FRT table is associated with a respective one of a plurality of ranges of program/erase cycles and with a respective one of a plurality of ranges of retention times. In the following, each pair of range of program/erase cycles and of range of retention times that identify a table entry will be concisely referred to as range pair (i.e., with each table entry that is associated with a respective range pair).

An example of such a FRT table for a generic memory page is the following (the optimal reference voltages within the table entries being not shown):

|  | [0, 9] days | (9, 27] days | (27, 45] days | (45, 63] days | (63, 81] days | (81, 90] days |
|---|---|---|---|---|---|---|
| [0, 1.5]*10³ P/E |  |  |  |  |  |  |
| (1.5, 2.5]*10³ P/E |  |  |  |  |  |  |
| (2.5, 3.5]*10³ P/E |  |  |  |  |  |  |
| (3.5, 4.5]*10³ P/E |  |  |  |  |  |  |
| (4.5, 5.5]*10³ P/E |  |  |  |  |  |  |
| (5.5, 6.5]*10³ P/E |  |  |  |  |  |  |
| (6.5, 7]*10³ P/E |  |  |  |  |  |  | wherein:
[0, 1.5]*10³ P/E, (1.5, 2.5]*10³ P/E, (2.5, 3.5]*10³ P/E, (3.5, 4.5]*10³ P/E, (4.5, 5.5]*10³ P/E, (5.5, 6.5]*10³ P/E, and (6.5, 7]*10³ P/E represent exemplary (and not limiting) ranges of program/erase (P/E) cycles (e.g., expressed in numbers of program/erase cycles), and [0, 9] days, (9, 27] days, (27, 45] days, (45, 63] days, (63, 81] days, and (81, 90] days represent exemplary (and not limiting) ranges of retention times (e.g., expressed in days).

According to an embodiment, the number of optimal reference voltages within each table entry of the FRT table depends on the number of bits each memory cell is capable of storing. Considering, just as an example, TLC memory cell that may be programmed and read at memory page level (wherein 2 hard reference voltages are required for reading each LSB page, 3 hard reference voltages are required for reading each CSB page and 2 hard reference voltages are required for reading each MSB page), the FRT table associated with the LSB page comprises two optimal reference voltages within each table entry, the FRT table associated with the CSB page comprises three optimal reference voltages within each table entry, and the FRT table associated with the MSB page comprises two optimal reference voltages within each table entry.

As will be better appreciated from the following discussion, the FRT tables associated with different memory pages are independent from each other.

According to an embodiment, the SSD controller 105 is configured to store two such FRT tables associated with each memory page.

According to an embodiment, the FRT tables associated with a same memory page are associated with different numbers of read disturb cycles affecting that memory page. According to an embodiment, the FRT tables associated with a same memory page comprise a FRT table associated with a number of read disturb cycles (affecting the memory page) that is above a threshold number of read disturb cycles, and a FRT table associated with a number of read disturb cycles (affecting the memory page) that is below the threshold number of read disturb cycles. Therefore, in this embodiment, the optimal reference voltages provided in the same range pair of the two FRT tables associated with a same memory page are indicative of the reference voltages to be used during the read operation of the memory page when the program/erase cycle and/or the retention time of the memory page fall within that range pair and when a number of read disturb cycles affecting the memory page is above or below, respectively, the threshold number of read disturb cycles. In the following, the number of read disturb cycles above the threshold number of read disturb cycles will be concisely referred to also as read disturb scenario (i.e., presence of read disturb), the number of read disturb cycles below the threshold number of read disturb cycles will be concisely referred to also no read disturb scenario (i.e., absence of read disturb), and each triplet of range of program/erase cycles, of range of retention times, and of range of read disturb cycles (i.e., read disturb scenario or no read disturb scenario) will be concisely referred to as "state" of the SSD device 100.

FIG. 3 shows an activity diagram of a procedure (hereinafter, FRT procedure) 300 for determining the FRT tables according to embodiments of the present invention.

According to an embodiment, the FRT procedure 300 is performed during a characterization phase of the SSD device 100. According to an embodiment, the characterization phase comprises a known characterization test (performed by the manufacturer) aimed at evaluating electrical and operative parameters of the SSD device 100, such as the threshold voltage distributions of the memory cells. According to an embodiment, the characterization test of the SSD device 100 is performed under a plurality of test conditions (as better discussed on the following).

Basically, the optimal reference voltages are selected among a plurality of reference voltages resulting from the characterization test of the SSD device 100, wherein the plurality of reference voltages comprise, for each state (or, equivalently, for each range pair when no read disturb scenario is considered):

state reference voltages indicative of the reference voltages at which the memory page falling within said state is successfully read during the characterization test, and adjacent state reference voltages indicative of the reference voltages at which the memory page falling within one or more adjacent states being adjacent to said state is successfully read during the characterization test.

Hereinafter, the state reference voltages and the adjacent state reference voltages will be globally referred to as reference voltages, when distinguishing between the state reference voltages and the adjacent state reference voltages is not relevant for the understanding of the present invention.

According to an embodiment, the FRT procedure 300 comprises, for each state (or, equivalently, for each range pair when no read disturb scenario is considered), grouping the plurality of reference voltages resulting from the characterization test (and including both the state reference voltages associated with that state and the adjacent state reference voltages associated with one or more adjacent states) into groups of candidate reference voltages (action node 305).

According to an embodiment, for each state, each group of candidate reference voltages is associated with a respective adjacency criterion for the adjacent states being adjacent to that state. Otherwise stated, for each state, each group of candidate reference voltages is obtained from the state reference voltages associated with that state and from adjacent state reference voltages associated with adjacent states determined based on a respective adjacency criterion.

According to an embodiment, a plurality of different adjacency criteria are considered. According to an embodiment, the following adjacency criteria (or, in alternative embodiment, a subset thereof) are considered (the adjacency criteria being herein listed from the most inclusive one to the least inclusive one):

According to an embodiment, a plurality of different adjacency criteria are considered. According to an embodiment, the following adjacency criteria (or, in alternative embodiment, a subset thereof) are considered, (the adjacency criteria being herein listed from the most inclusive one to the least inclusive one and are schematically represented in FIGS. 5A TO 5E.

adjacency criterion (i) (FIG. 5A): according to adjacency criterion (i), for both read disturb and no read disturb scenarios, and for each considered range pair (such as the dark-patterned range pair), all the contiguous range pairs surrounding the considered range pair are regarded as adjacent range pairs (see the light-patterned range pairs). According to adjacency criterion (i), the range pairs in the read disturb scenario are considered adjacent to the respective range pairs of the no read disturb scenario. Adjacency criterion (i) is the most inclusive one:

adjacency criterion (ii) (FIG. 5B): according to adjacency criterion (ii), for both read disturb and no read disturb scenarios, and for each considered range pair (such as the dark-patterned range pair), all the contiguous range pairs surrounding the considered range pair except for the contiguous range pairs associated with the range of program/erase cycles that precedes the range of program erase/cycle of the considered range pair, are regarded as adjacent range pairs (see the light-patterned range pairs). According to adjacency criterion (ii), the range pairs in the read disturb scenario are considered adjacent to the respective range pairs of the no read disturb scenario;

adjacency criterion (iii) (FIG. 5C): according to adjacency criterion (iii), for both read disturb and no read disturb scenarios, and for each considered range pair (such as the dark-patterned range pair), all the contiguous range pairs surrounding the considered range pair except for the contiguous range pairs associated with the range of retention times that precedes the range of retention times of the considered range pair, are regarded as adjacent range pairs (see the light-patterned range pairs). According to adjacency criterion (iii), the range pairs in the read disturb scenario are considered adjacent to the respective range pairs of the no read disturb scenario:

adjacency criterion (iv) (FIG. 5D): according to adjacency criterion (iv), for each considered range pair (such as the dark-patterned range pair) in the no read disturb scenario, all the contiguous range pairs surrounding the considered range pair are regarded as adjacent range pairs (see the light-patterned range pairs). In other words, adjacency criterion (iv) is similar to adjacency criterion (i), with the exception that the read disturb scenario is not considered in the adjacency criterion (iv);

adjacency criterion (v) (FIG. 5E): according to adjacency criterion (v), for each considered range pair (such as the dark-patterned range pair) in the no read disturb scenario, only that range pair is regarded as adjacent range pair. In other words, according to adjacency criterion (v), only identical states are considered. Adjacency criterion (v) is the least inclusive one;

In the exemplary considered embodiment, the grouping of the plurality of candidate reference voltages performed at action node 305 is based on each one of the adjacency criteria (i)-(v). Therefore, in this embodiment, for each state, the groups of candidate reference voltages comprise:

groups of candidate reference voltages whose candidate reference voltages are obtained (e.g. selected, as discussed below) from the state reference voltages associated with that state and from adjacent state reference voltages associated with adjacent states determined based on the adjacency criterion (i);

groups of candidate reference voltages whose candidate reference voltages are obtained (e.g. selected, as discussed below) from the state reference voltages associated with that state and from adjacent state reference voltages associated with adjacent states determined based on the adjacency criterion (ii);

groups of candidate reference voltages whose candidate reference voltages are obtained (e.g. selected, as discussed below) from the state reference voltages associated with that state and from adjacent state reference voltages associated with adjacent states determined based on the adjacency criterion (iii);

groups of candidate reference voltages whose candidate reference voltages are obtained (e.g. selected, as discussed below) from the state reference voltages associated with that state and from adjacent state reference voltages associated with adjacent states determined based on the adjacency criterion (iv), and groups of candidate reference voltages whose candidate reference voltages are obtained (e.g. selected, as discussed below) from the state reference voltages associated with that state and from adjacent state reference voltages associated with adjacent states determined based on the adjacency criterion (v).

According to an embodiment, for each state, each group of candidate reference voltages is further associated with a respective test condition (e.g., among a plurality of test conditions) under which the characterization test of the SSD device 100 has been performed.

According to an embodiment, the test conditions comprise a plurality of temperatures.

Just as an example, two test conditions will be assumed, respectively referred to as test condition A and test condition B. Just as an example, test condition A is more demanding for the SSD device than test condition B.

Therefore, in this embodiment, for each state, the groups of candidate reference voltages comprise groups of candidate reference voltages whose candidate reference voltages comprise reference voltages resulting from the characterization test performed under test condition A, and groups of candidate reference voltages whose candidate reference voltages comprise reference voltages resulting from the characterization test performed under test condition B.

According to an embodiment, for each state, each group of candidate reference voltages is further associated with a respective selection criterion among a plurality of (e.g., two or more) selection criteria. According to an embodiment, the selection criterion allows selecting, among the plurality of reference voltages of each group of candidate reference voltages (associated with each state), the candidate reference voltages. According to an embodiment, for each state, for each group of candidate reference voltages the candidate reference voltages represent (among the respective state reference voltages and adjacent state reference voltages) the best options for that state. Therefore, based on the selection criterion being used, for each state, the candidate reference voltages of each group of candidate reference voltages comprise reference voltages selected among the respective state reference voltages and the respective adjacent state reference voltages. As better understood from the following discussion, at the end of the FRT procedure 300 the candidate reference voltages of a few chosen groups of candidate reference voltages represent the optimal reference voltages.

According to an embodiment, the selection criteria comprise:

a first selection criterion (hereinafter, "$2^{nd}$-worst selection criterion") wherein, for each state, the candidate reference voltages comprise the reference voltages (among the respective reference voltages that, as a result of the characterization tests, fall within that state) whose second-worst number of read errors is the lowest. The $2^{nd}$-worst selection criterion allows discarding the effective worst, since it is assumed that it can be recovered by a soft read operation;

a second selection criterion (hereinafter, "50% distribution selection criterion") wherein, for each state, the candidate reference voltages comprise the reference voltages (among the respective reference voltages that, as a result of the characterization tests, fall within that range pair) whose number of read errors has the lowest median. The 50% distribution selection criterion allows avoiding to overly penalize sets of reference voltages having a few outliers.

In the exemplary considered embodiment, the grouping of the plurality of candidate reference voltages performed at action node 305 is based on each one of the selection criteria.

Therefore, in the exemplary considered embodiment in which the grouping of the candidate reference voltages performed at action node 305 is carried out for each adjacency criterion, for each test condition, and for each selection criterion, a plurality of versions of FRT tables for each state are obtained. In the practical example of five adjacency criteria ((i)-(v)), two test conditions (A, B), two selection criteria ($2^{nd}$ worst selection criterion and 50% distribution selection criterion), and two ranges of read disturb cycles, 40 versions of FRT tables for each state are obtained for each memory page.

According to an embodiment, the FRT procedure 300 comprises designating a number of groups of candidate reference voltages among the plurality of groups of candidate reference voltages, thereby obtaining a number of designated groups of candidate reference voltages (action node 310).

According to an embodiment, the number of designated groups of candidate reference voltages comprise the groups of candidate reference voltages in which, for a predetermined state, the respective candidate reference voltages have resulted, during the characterization test, in a number of read errors lower than a threshold number of read errors. According to an embodiment, the threshold number of read errors may be a predetermined cut-off percentage of an ECC threshold. Considering, just as an example, a cut-off percentage of 50% and an ECC threshold of 300, the corresponding designated groups of candidate reference voltages comprise candidate reference voltages resulting in less than 150 errors per chunk.

According to an embodiment, for each state, each designated group of candidate reference voltages is determined based on a respective sorting criterion among a plurality of (e.g., two or more) sorting criteria for the adjacency criteria.

According to an embodiment, the sorting criteria comprise:

a first sorting criterion according to which the groups of candidate reference voltages are sorted from the least inclusive adjacency criterion to the most inclusive adjacency criterion. In the example at issue, according to the first sorting criterion, the groups of candidate reference voltages are sorted from the adjacency criterion (v) to the adjacency criterion (i) in the following order: adjacency criterion (v), adjacency criterion (iv), adjacency criterion (iii), adjacency criterion (ii), adjacency criterion (i), and a second sorting criterion according to which the groups of candidate reference voltages are sorted from the most inclusive adjacency criterion to the least inclusive adjacency criterion. In the example at issue, according to the second sorting criterion, the groups of candidate reference voltages are sorted from the adjacency criterion (i) to the adjacency criterion (v) in the following order: adjacency criterion (i), adjacency criterion (ii), adjacency criterion (iii), adjacency criterion (iv), adjacency criterion (v).

According to an embodiment, for each state, the designated groups of candidate reference voltages are determined as follows: if the first group of candidate reference voltages (i.e., the group of candidate reference voltages that, according to the sorting criterion, is the first one) has resulted, during the characterization test, in a number of read errors lower than the threshold number of read errors, then the first group of candidate reference voltages is the designated group of candidate reference voltages, otherwise the subsequent groups of candidate reference voltages are considered one by one according to the sorting criterion. According to an embodiment, if none of the considered groups of candidate reference voltages meets the condition about the number of read errors, the group of candidate reference voltages corresponding to the least inclusive adjacency criterion (i.e., the adjacency criterion (v), in the example at issue) is considered as the designated group of candidate reference voltages.

In the exemplary considered embodiment, the designated groups of candidate reference voltages are determined, for each state, based on each one of the sorting criteria.

Therefore, in the exemplary considered embodiment in which, for each state, the groups of candidate reference voltages comprise groups of candidate reference voltages that differ from each other by test condition and by selection criterion, the designated groups of candidate reference voltages determine, for each state, a reduction in the number of versions of FRT tables as compared to the versions of FRT tables obtained at action node 305. In the practical example of two test conditions (A, B), two selection criteria ($2^{nd}$-worst selection criterion and 50% distribution selection criterion), two sorting criteria, and two ranges of read disturb cycles, for each state 16 versions of FRT tables (from the 40 versions of FRT tables obtained at action node 305) are obtained for each memory page at action node 310.

According to an embodiment, the FRT procedure 300 comprises electing, for each state, one among the designated groups of candidate reference voltages (action node 315). According to an embodiment, the elected designated group of candidate reference voltages comprises, for each state, the designated group of candidate reference voltages, among the designated groups of candidate reference voltages, in which the percentage (hereinafter, success percentage) of candidate reference voltages having resulted, during the characterization test, in a number of read errors lower than the threshold number of read errors is, for the worst state, the highest.

Let be considered, just as an example, the following designated groups of candidate reference voltages, ranked from the highest success percentage to the lowest success percentage of the respective worst state, wherein for each designated group of candidate reference voltages the selection and sorting criteria used to obtain it and the test condition under which the corresponding candidate reference voltages have been obtained are indicated:

| Rank | Test condition | Selection criterion | Sorting criterion | Worst state |
|---|---|---|---|---|
| 1 | A | 50% distribution | Least inclusive | 99.1% |
| 2 | B | 50% distribution | Most inclusive | 99.0% |
| 3 | A | 50% distribution | Most inclusive | 97.2% |
| 4 | B | 50% distribution | Least inclusive | 97.0% |
| 5 | B | $2^{nd}$ worst | Most inclusive | 92.2% |
| 6 | B | $2^{nd}$ worst | Least inclusive | 91.5% |
| 7 | A | $2^{nd}$ worst | Least inclusive | 87.7% |
| 8 | A | $2^{nd}$ worst | Most inclusive | 86.5% |

In this example, the designated group of candidate reference voltages ranked as "1" is the elected designated group of candidate reference voltages, whereby the candidate reference voltages of the elected designated group of candidate reference voltages are the optimal reference voltages.

According to an embodiment, action node 315 is performed as discussed above for each memory page.

According to an embodiment, action node 315 is performed as discussed above for both read disturb scenario and no read disturb scenario (so as to obtain, for each memory page, a FRT table for the read disturb scenario and a FRT table for the no read disturb scenario).

According to an embodiment, the FRT procedure 300 comprises determining, for each memory page, a backup FRT table (action node 325). As better discussed in the following, the backup FRT table is used, during a decoding procedure, if the optimal reference voltages provided in the FRT table (which will be referred to also as main FRT table) result in an unsuccessful read operation, in which case the backup FRT table may provide valid and working substitute optimal reference voltages (hereinafter, backup optimal reference voltages).

According to an embodiment, the backup FRT table is conceptually equivalent to the main FRT table, i.e. it comprises a plurality of table entries associated with the range pairs and a plurality of backup optimal reference voltages within the table entries, wherein the backup optimal reference voltages within each table entry are indicative of the reference voltages to be used during the read operation of the memory page when the program/erase cycle and/or the retention time of the memory page fall within the respective range pair.

According to an embodiment, the backup FRT table is determined based on one or more backup elected designated groups of candidate reference voltages (wherein the backup elected designated groups of candidate reference voltages are different from the elected designated group of candidate reference voltages determined at action node 320). According to an embodiment, each backup elected designated groups of candidate reference voltages comprises the designated group of candidate reference voltages, among said number of designated groups of candidate reference voltages, in which the success percentage is lower than the highest one.

Considering, just as an example, the designated groups of candidate reference voltages of above, which are ranked from the highest success percentage to the lowest success percentage of the respective worst state, the designated group of candidate reference voltages ranked as "2" may be the backup elected designated group of candidate reference voltages, whereby the candidate reference voltages of the backup elected designated group of candidate reference voltages are taken as the backup optimal reference voltages.

According to an embodiment, for each state wherein the backup optimal reference voltages are the same as the optimal reference voltages, for that state the optimal reference voltages of the following ranked designated groups of candidate reference voltages are considered (in the example at issue, the designated group of candidate reference voltages ranked as "3" is considered first, then the designated group of candidate reference voltages ranked as "4" is considered, and so on): this allows avoiding redundancy between the optimal reference voltages of the main FRT table and the backup optimal reference voltages of the backup FRT table.

According to an embodiment, if the backup FRT table exhibits one or more empty table entries, a group of candidate reference voltages other than the designated groups of candidate reference voltages (hereinafter, undesignated group of candidate reference voltages) is determined for the states corresponding to those empty table entries. According to an embodiment, the undesignated group of candidate reference voltages comprises a group of candidate reference voltages featuring a combination of selection criterion, test condition, and adjacency criterion which is different from the combination of selection criterion, test condition and adjacency criterion of any of the designated groups of candidate reference voltages.

According to an embodiment, determination of the undesignated group of candidate reference voltages is reiterated until the backup FRT table exhibits no empty table entries (wherein, at each iteration, a different undesignated group of candidate reference voltages is determined).

According to an embodiment, a plurality of backup FRT tables may be determined as discussed above.

Considering, just as an example, one main FRT table and two backup FRT tables for both read disturb and no read disturb scenarios, the FRT procedure 300 generates 6 FRT tables for each i-th memory page (wherein i=1, 2, 3 in the example at issue of three memory pages), namely:

a main FRT table for the read disturb scenario, denoted by FRT table $FRT_1(RD)_i$;

a main FRT table for the no read disturb scenario, denoted by FRT table $FRT_1(noRD)_i$;

a first backup FRT table for the read disturb scenario, denoted by FRT table $FRT_2(RD)_i$;

a first backup FRT table for the no read disturb scenario, denoted by FRT table $FRT_2(noRD)_i$;

a second backup FRT table for the read disturb scenario, denoted by FRT table $FRT_3(RD)_i$;

a second backup FRT table for the no read disturb scenario, denoted by FRT table $FRT_3(noRD)_i$.

Without losing generality, any number Q of FRT tables $FRT_q(RD)_i, FRT_q(noRD)_i$ (q=1, 2, ..., Q) may be provided.

According to an embodiment, the FRT tables $FRT_q(RD)_i, FRT_q(noRD)_i$ are stored in the SSD controller 105.

According to an embodiment, the FRT tables $FRT_q(RD)_i, FRT_q(noRD)_i$ are stored in the control unit 125, as schematically illustrated in FIG. 1B.

FIG. 4 schematically shows an activity diagram of a decoding procedure 400 carried out by the SSD controller 105 according to embodiments of the present invention.

According to an embodiment, the decoding procedure 400 is performed during normal operation of the SSD device 100, i.e. when the SSD device 100 is marketed and used by the end user (and, particularly, when read operations are carried out by the end user on the SSD device 100).

According to an embodiment, the decoding procedure 400 is based on the FRT tables.

The decoding procedure 400 comprises, after a read request (action node 405), determining a current state of the SSD device 100 (action node 410).

In the exemplary considered embodiment in which each state is identified by a triplet of range of program/erase cycles, of range of retention times, and of a range of read disturb cycles, the current state of the SSD device 100 is determined at action node 410 by determining a current program/erase cycle, a current retention time, and a current number of read disturb cycles (and by "locating" them within the respective ranges of the FRT tables).

According to an embodiment, if the current state of the SSD device 100 does not fall within an admitted state that is admitted by the FRT tables (exit branch N of decision node 415) (in the above numerical example, this could be the case, for example, when the current number of program/erase cycles is above 7000, and/or if the current retention time is above 90 days), the decoding procedure 400 comprises performing conventional read operations (action node 420) and conventional decoding operations (action node 425), i.e. read operations and decoding operations performed without using the FRT tables.

According to an embodiment, read operations performed at action node 420 may comprise hard read operations by using the predefined or nominal hard reference voltages $V_k$, and soft read operations (by using the soft reference voltages $V_{kA}$-$V_{kF}$ associated with each hard reference voltage $V_k$) in case of failure of the hard read operations.

According to an embodiment, the decoding operations performed at action node 425 comprise conventional hard or soft decoding depending on whether hard or soft read operations have been performed at action node 420, respectively.

According to an embodiment, if the current state of the SSD device 100 falls within an admitted state that is admitted by the FRT tables (exit branch Y of decision node 415) (in the above numerical example, this could be the case, for example, of a current number of program/erase cycles and of a current retention time falling within a corresponding range pair), the decoding procedure 400 comprises performing read operations based on the FRT tables (nodes 430-450).

According to an embodiment, the decoding procedure 400 comprises, if the current state of the SSD device 100 falls within an admitted state (exit branch Y of decision node 415), retrieving the main FRT table, namely the main FRT table $FRT_1(RD)_i$ or the main FRT table $FRT_1(noRD)_i$, depending on the number of read disturb cycles, (q=1, action node 430), and performing a read operation based on the optimal reference voltages provided in the table entry of the main FRT table corresponding to the current state (action node 435).

According to an embodiment, the decoding procedure 400 comprises, if the read operation based on the main FRT table is unsuccessful (exit branch N of decision node 440), retrieving the first backup FRT table, namely the first backup FRT table $FRT_2(RD)_i$ or the first backup FRT table $FRT_2(noRD)_i$, depending on the number of read disturb cycles, (q=2, action node 445), and performing a read operation based on the backup optimal reference voltages provided in the table entry of the first backup FRT table corresponding to the current state (action node 435).

More generally, according to an embodiment, the decoding procedure 400 comprises, if the read operation based on the k-th FRT table $FRT_q(RD)_i, FRT_q(RD)_i$ is unsuccessful (exit branch N of decision node 440), retrieving the following FRT table $FRT_q(RD)_i, FRT_q(RD)_i$ (q=q+1, action node 445) and performing a read operation based on that FRT table $FRT_q(RD)_i, FRT_q(RD)_i$ (action node 435).

According to an embodiment, nodes 435-445 are iterated until the read operation is successful. According to an embodiment, if the read operation performed at action node 435 by using the optimal reference voltages or the backup optimal reference voltages is successful (exit branch Y of decision node 440), then conventional hard decoding is performed (action node 420). Therefore, in this case, soft read and subsequent soft decoding are avoided.

According to an embodiment, 435-445 are iterated as long as the read operation is unsuccessful (exit branch N of decision node 440) and the available FRT tables $FRT_q(RD)_i, FRT_q(RD)_i$ have not ended (q≤Q, exit branch Y of decision node 450).

According to an embodiment, if the read operations have been unsuccessful for all the available FRT tables $FRT_q(RD)_i, FRT_q(RD)_i$ (exit branch N of decision node 440, and exit branch N of the decision node 450) the decoding procedure 400 comprises performing conventional soft read operations (action node 420) and soft decoding operations (action node 425).

Thanks to the FRT tables $FRT_q(RD)_i, FRT_q(noRD)_i$, the SSD device 100 is capable of re-centering the threshold voltage distributions $D_j$ by replacing the hard reference voltages $V_k$ (which are predefined, conventionally determined hard reference voltages) with the optimal reference voltages that take into account SSD device current aging.

This is achieved by the FRT procedure 300, which allows determining offline (aprioristically) a few FRT tables $FRT_q(RD)_i, FRT_q(noRD)_i$, and by the decoding procedure 400 based on these FRT tables $FRT_q(RD)_i, FRT_q(noRD)_i$, which allows improving error correction capabilities of hard decoding (thus limiting soft decoding as much as possible).

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A solid state storage device comprising:
   a plurality of programmable memory cells each one capable of storing a bit pattern, among a plurality of bit patterns, comprising one or more bits, the memory cells being programmed and read at memory page level, and
   a controller for storing at least one table associated with a memory page, wherein each table comprises:
   a plurality of table entries each one associated with a respective range pair, a range pair being a pair of ranges of numerical values, said range pair comprising a range of numerical values of program/erase cycles of a succession of non-overlapping ranges of numerical values of program/erase cycles and a range of numerical values of retention times of a succession of non-overlapping ranges of numerical values of retention times, the range pair associated with each table entry being indicative of an aging state of the memory page, and
   stored in each table entry, a plurality of optimal reference voltages, the optimal reference voltages stored in each table entry being indicative of the hard reference voltages to be used, in a normal operation of the solid state storage device at end user side, during a read operation of the memory page when a current numerical value of program/erase cycles and of retention times of the memory page indicative of a current aging state of the memory page at the time of said read operation fall within the range pair associated with the table entry, each optimal reference voltage stored in each table entry being used during the read operation for discriminating a respective pair of adjacent bit patterns different from any other pair of adjacent bit patterns discriminated by the remaining optimal reference voltages stored in the table entry;
   wherein the plurality of optimal reference voltages are selected and stored in each table entry, in a selection process during a characterization test of the solid state storage device carried out at manufacturer side before the normal operation of the solid state storage device, among a plurality of candidate reference voltages resulting from the characterization test, the plurality of candidate reference voltages comprising, for each range pair associated with a respective table entry:
   first candidate reference voltages associated with said range pair associated with the respective table entry and indicative of the reference voltages at which the memory page with the respective numerical value of program/erase cycles and of retention times falling within said range pair associated with the respective table entry is successfully read during the characterization test, and
   second candidate reference voltages associated with a plurality of adjacent range pairs being adjacent to said range pair associated with the respective table entry, the plurality of adjacent range pairs comprising:
   at least one first adjacent range pair each one comprising a respective adjacent range of numerical values of program/erase cycles being adjacent, in the succession of ranges of numerical values of program/erase cycles, to the range of numerical values of program/erase cycles of said range pair associated with the respective table entry, and the range of numerical values of retention times of said range pair associated with the respective table entry,
   at least one second adjacent range pair each one comprising a respective adjacent range of numerical values of retention times being adjacent, in the succession of ranges of numerical values of retention times, to the range of numerical values of retention times of said range pair associated with the respective table entry, and the range of numerical values of program/erase cycles of said range pair associated with the respective table entry, and
   at least one third adjacent range pair each one comprising a respective adjacent range of numerical values of program/erase cycles being adjacent to the range of numerical values of program/erase cycles of said range pair associated with the respective table entry and a respective adjacent range of numerical values of retention times being adjacent to the range of numerical values of retention times of said range pair associated with the respective table entry,
   the second candidate reference voltages associated with each adjacent range pair being indicative of the reference voltages at which the memory page with the respective numerical value of program/erase cycles and of retention times falling within the adjacent range pair is successfully read during the characterization test,
   and wherein
   each optimal reference voltage stored in each table entry comprises, as a result of said selection process, a respective one of the first candidate reference voltages or a respective one of the second candidate reference voltages.

2. The solid state storage device according to claim 1, wherein, for each range pair associated with a respective table entry, the plurality of candidate reference voltages comprise a plurality of groups of candidate reference voltages, each group of candidate reference voltages comprising:
   the first candidate reference voltages associated with said range pair associated with the respective table entry, and
   the second candidate reference voltages associated with a respective number of said at least one first adjacent range pair, of said least one second adjacent range pair and of said at least one third adjacent range pair according to a respective adjacency criterion, and wherein the plurality of optimal reference voltages are selected and stored in each table entry from the first and second candidate reference voltages of a number of designated groups of candidate reference voltages, the number of designated groups of candidate reference voltages being designated among the plurality of groups of candidate reference voltages.

3. The solid state storage device according to claim 2, wherein, for each range pair associated with a respective table entry, the number of designated groups of candidate reference voltages comprise the groups of candidate reference voltages in which the respective first and second candidate reference voltages have resulted, during the characterization test, in a number of read errors lower than a threshold number of read errors.

4. The solid state storage device according to claim 3, wherein each designated group of candidate reference voltages comprises a respective worst range pair, among the range pair associated with the respective table entry and the respective adjacent range pairs, having the fewest associated candidate reference voltages that have resulted in a number of read errors lower than said threshold number of read errors, and wherein the plurality of optimal reference voltages stored in each table entry are selected among the first and second candidate reference voltages of an elected designated group of candidate reference voltages being elected among said number of designated groups of candidate reference voltages, the elected designated group of candidate reference voltages comprising the designated group of candidate reference voltages, among said number of designated groups of candidate reference voltages, in which the respective candidate reference voltages that have resulted in a number of read errors lower than said threshold number of read errors, for the worst range pair, are in the highest percentage, wherein the number of read errors is obtained during the characterization test.

5. The solid state storage device according to claim 2, wherein each group of candidate reference voltages is further associated with a respective one of a plurality of test conditions under which the characterization test of the solid state storage device has been performed.

6. The solid state storage device according to claim 5, wherein the plurality of test conditions comprise a plurality of temperatures.

7. The solid state storage device according to claim 2, wherein each group of candidate reference voltages is further associated with a respective one of a plurality of selection criteria for selecting the optimal reference voltages among the plurality of candidate reference voltages.

8. The solid state storage device according to claim 7, wherein the plurality of selection criteria comprise:
a first selection criterion wherein, for each range pair associated with a respective table entry, the optimal reference voltages comprise the candidate reference voltages, among the respective first and second candidate reference voltages, which have the lowest second-worst number of read errors;
a second selection criterion wherein, for each range pair associated with a respective table entry, the optimal reference voltages comprise the candidate reference voltages, among the respective first and second candidate reference voltages, which have the number of read errors with the lowest median.

9. The solid state storage device according to claim 1, wherein the at least one table comprises a first and a second tables, wherein the plurality of optimal reference voltages stored in the first table are indicative of the reference voltages to be used during the read operation of the memory page when a number of read disturb cycles affecting the memory page is above a threshold number of read disturb cycles, and the plurality of optimal reference voltages stored in the second table are indicative of the reference voltages to be used during the read operation of the memory page when the number of read disturb cycles affecting the memory page is below the threshold number of read disturb cycles.

10. The solid state storage device according to claim 4, wherein the controller is configured to store an additional table associated with the memory page, the additional table comprising a plurality of additional table entries associated with said range pairs associated with the respective table entries and a plurality of additional optimal reference voltages stored in the additional table entries, the additional optimal reference voltages stored in each additional table entry being indicative of the hard reference voltages to be used, in the normal operation of the solid state storage device, during the read operation of the memory page when the current numerical value of program/erase cycles and of retention times of the memory page fall within the respective range pair, each additional optimal reference voltage stored in each additional table entry being used during the read operation for discriminating a respective pair of adjacent bit patterns different from any other pair of adjacent bit patterns discriminated by the remaining additional optimal reference voltages stored in the additional table entry;
wherein the additional optimal reference voltages are selected among the first and second candidate reference voltages of an additional elected designated group of candidate reference voltages among said number of designated groups of candidate reference voltages, the additional elected designated group of candidate reference voltages comprising the designated group of candidate reference voltages, among said number of designated groups of candidate reference voltages, in which the respective candidate reference voltages having resulted in a number of read errors lower than said threshold number of read errors during the characterization test are in a lower percentage than said highest percentage.

11. The solid state storage device according to claim 1, wherein the controller is configured to, after a request for carrying out the read operation of the memory page:
determine a current numerical value of program/erase cycles and of retention times of the memory page;
identify the range pair to which the current numerical value of program/erase cycles and of retention times belong, and
perform a hard read operation based on the optimal reference voltages stored in the table entry associated with the identified range pair.

12. The solid state storage device according to claim 10, wherein the controller is configured to, after a request for carrying out the read operation of the memory page:
determine a current numerical value of program/erase cycles and of retention times of the memory page;
identify the range pair to which the current numerical value of program/erase cycles and of retention times belong;
perform a hard read operation based on the optimal reference voltages stored in the table entries associated with the identified range pair, and in case of unsuccessful hard read operation, perform a hard read operation based on the additional optimal reference voltages stored in the additional table entries associated with the identified range pair.

13. A controller for a solid state storage device, wherein the solid state storage device comprises a plurality of programmable memory cells each one capable of storing a bit pattern, among a plurality of bit patterns, comprising one or more bits, the memory cells being programmed and read at memory page level, wherein the controller is configured to store at least one table associated with a memory page, wherein each table comprises:
  a plurality of table entries each one associated with a respective range pair, a range pair being a pair of ranges of numerical values comprising a range of numerical values of program/erase cycles of a succession of non-overlapping ranges of numerical values of program/erase cycles and a range of numerical values of retention times of a succession of non-overlapping ranges of numerical values of retention times, the range pair associated with each table entry being indicative of an aging state of the memory page, and
  stored in each table entry, a plurality of optimal reference voltages, the optimal reference voltages stored in each table entry being indicative of the hard reference voltages to be used, in a normal operation of the solid state storage device at end user side, during a read operation of the memory page when a current numerical value of program/erase cycle and of retention times of the memory page indicative of a current aging state of the memory page at the time of said read operation fall within the range pair associated with the table entry, each optimal reference voltage stored in each table entry being used during the read operation for discriminating a respective pair of adjacent bit patterns different from any other pair of adjacent bit patterns discriminated by the remaining optimal reference voltages in the table entry;
  wherein the plurality of optimal reference voltages are selected and stored in each table entry, in a selection process during a characterization test of the solid state storage device carried out at manufacturer side before the normal operation of the solid state storage device, among a plurality of candidate reference voltages resulting from the characterization test, the plurality of candidate reference voltages comprising, for each range pair associated a respective table entry:
    first candidate reference voltages associated with said range pair associated with the respective table entry and indicative of the reference voltages at which the memory page with the respective numerical value of program/erase cycles and of retention times falling within said range pair associated with the respective table entry is successfully read during the characterization test, and
    second candidate reference voltages associated with a plurality of adjacent range pairs being adjacent to said range pair associated with the respective table entry, the plurality of adjacent range pairs comprising:
      at least one first adjacent range pair each one comprising a respective adjacent range of numerical values of program/erase cycles being adjacent, in the succession of ranges of numerical values of program/erase cycles, to the range of numerical values of program/erase cycles of said range pair associated with the respective table entry, and the range of numerical values of retention times of said range pair associated with the respective table entry,
      at least one second adjacent range pair each one comprising a respective adjacent range of numerical values of retention times being adjacent, in the succession of ranges of numerical values of retention times, to the range of numerical values of retention times of said range pair associated with the respective table entry, and the range of numerical values of program/erase cycles of said range pair associated with the respective table entry, and
      at least one third adjacent range pair each one comprising a respective adjacent range of numerical values of program/erase cycles being adjacent to the range of numerical values of program/erase cycles of said range pair associated with the respective table entry and a respective adjacent range of numerical values of retention times being adjacent to the range of numerical values of retention times of said range pair associated with the respective table entry,
    the second candidate reference voltages associated with each adjacent range pair being indicative of the reference voltages at which the memory page with the respective numerical value of program/erase cycles and of retention times falling within the adjacent range pair is successfully read during the characterization test,
  and wherein
  each optimal reference voltage stored in each table entry comprises, as a result of said selection process, a respective one of the first candidate reference voltages or a respective one of the second candidate reference voltages.

14. The controller according to claim 13, wherein for each range pair associated with a respective table entry, the plurality of candidate reference voltages comprise a plurality of groups of candidate reference voltages, each group of candidate reference voltages comprising:
  the first candidate reference voltages associated with said range pair associated with the respective table entry, and
  the second candidate reference voltages associated with a respective number of said at least one first adjacent range pair, of said least one second adjacent range pair and of said at least one third adjacent range pair according to a respective adjacency criterion,
  and wherein the plurality of optimal reference voltages are selected and stored in each table entry from the first and second candidate reference voltages of a number of designated groups of candidate reference voltages, the number of designated groups of candidate reference voltages being designated among the plurality of groups of candidate reference voltages.

15. The controller according to claim 14, wherein, for each range pair associated with a respective table entry, the number of designated groups of candidate reference voltages comprise the groups of candidate reference voltages in which the respective first and second candidate reference voltages have resulted, during the characterization test, in a number of read errors lower than a threshold number of read errors.

16. The controller according to claim 15, wherein each designated group of candidate reference voltages comprises a respective worst range pair, among the range pair associated with the respective table entry and the respective adjacent range pairs, having the fewest associated candidate reference voltages that have resulted in a number of read errors lower than said threshold number of read errors, and wherein the plurality of optimal reference voltages stored in each table entry are selected among the first and second candidate reference voltages of an elected designated group of candidate reference voltages being elected among said number of designated groups of candidate reference voltages, the elected designated group of candidate reference voltages comprising the designated group of candidate reference voltages, among said number of designated groups of candidate reference voltages, in which the respective candidate reference voltages that have resulted in a number of read errors lower than said threshold number of read errors, for the worst range pair, are in the highest percentage, wherein the number of read errors is obtained during the characterization test.

17. The controller according to claim 14, wherein each group of candidate reference voltages is further associated with a respective one of a plurality of test conditions under which the characterization test of the solid state storage device has been performed.

18. The controller according to claim 17, wherein the plurality of test conditions comprise a plurality of temperatures.

19. The controller according to claim 14, wherein each group of candidate reference voltages is further associated with a respective one of a plurality of selection criteria for selecting the optimal reference voltages among the plurality of candidate reference voltages.

20. The controller according to claim 19, wherein the plurality of selection criteria comprise:
   a first selection criterion wherein, for each range pair associated with a respective table entry, the optimal reference voltages comprise the candidate reference voltages, among the respective first and second candidate reference voltages, which have the lowest second-worst number of read errors;
   a second selection criterion wherein, for each range pair associated with a respective table entry, the optimal reference voltages comprise the candidate reference voltages, among the respective first and second candidate reference voltages, which have the number of read errors with the lowest median.

21. The controller according to claim 13, wherein the at least one table comprises a first and a second tables, wherein the plurality of optimal reference voltages stored in the first table are indicative of the reference voltages to be used during the read operation of the memory page when a number of read disturb cycles affecting the memory page is above a threshold number of read disturb cycles, and the plurality of optimal reference voltages stored in in the second table are indicative of the reference voltages to be used during the read operation of the memory page when the number of read disturb cycles affecting the memory page is below the threshold number of read disturb cycles.

22. The controller according to claim 16, wherein the controller is configured to store an additional table associated with the memory page, the additional table comprising a plurality of additional table entries associated with said range pairs associated with the respective table entries and a plurality of additional optimal reference voltages stored in the additional table entries, the additional optimal reference voltages stored in each additional table entry being indicative of the reference voltages to be used, in the normal operation of the solid state storage device, during the read operation of the memory page when the current numerical value of program/erase cycles and of retention times of the memory page fall within the respective range pair, each additional optimal reference voltage stored in each additional table entry being used during the read operation for discriminating a respective pair of adjacent bit patterns different from any other pair of adjacent bit patterns discriminated by the remaining additional optimal reference voltages stored in the additional table entry; wherein the additional optimal reference voltages are selected among the first and second candidate reference voltages of an additional elected designated group of candidate reference voltages among said number of designated groups of candidate reference voltages, the additional elected designated group of candidate reference voltages comprising the designated group of candidate reference voltages, among said number of designated groups of candidate reference voltages, in which the respective candidate reference voltages having resulted in a number of read errors lower than said threshold number of read errors during the characterization test are in a lower percentage than said highest percentage.

23. The controller according to claim 13, wherein the controller is configured to, after a request for carrying out the read operation of the memory page:
   determine a current numerical value of program/erase cycles and/or of retention times of the memory page;
   identify the range pair to which the current numerical value of program/erase cycles and of retention times belong, and
   perform a hard read operation based on the optimal reference voltages stored in the table entry associated with the identified range pair.

24. The controller according to claim 22, wherein the controller is configured to, after a request for carrying out the read operation of the memory page:
   determine a current numerical value of program/erase cycles and/or of retention times of the memory page;
   identify the range pair to which the current numerical value of program/erase cycles and of retention times belong;
   perform a hard read operation based on the optimal reference voltages within the table entry associated with the identified range pair, and
   in case of unsuccessful hard read operation, perform a hard read operation based on the additional optimal reference voltages stored in the additional table entry associated with the identified range pair.

25. Method for operating a solid state storage device comprising a plurality of programmable memory cells each one capable of storing a bit pattern, among a plurality of bit patterns, comprising one or more bits, the memory cells being programmed and read at memory page level, the method comprising:
   storing at least one table associated with a memory page, wherein each table comprises:
   a plurality of table entries each one associated with a respective range pair, a range pair being a pair of ranges of numerical values comprising a range of numerical values of program/erase cycles of a succession of non-overlapping ranges of numerical values of program/erase cycles and a range of numerical values of retention times of a succession of non-overlapping ranges of numerical values of retention times, the range pair associated with each table entry being indicative of an aging state of the memory page, and
   stored in each table entry, a plurality of optimal reference voltages, the optimal reference voltages stored in each table entry being indicative of the hard reference voltages to be used, in a normal operation of the solid state storage device at end user side, during a read operation of the memory page responsive to a current numerical value of program/erase cycles and of retention times of the memory page indicative of a current aging state of the memory page at the time of said read operation falling within the range pair associated with the table entry, each optimal reference voltage stored in each table entry being used during the read operation for discriminating a respective pair of adjacent bit patterns different from any other pair of adjacent bit patterns discriminated by the remaining optimal reference voltages stored in the table entry;

wherein the method further comprises selecting, in a selection process during a characterization test of the solid state storage device carried out at manufacturer side before normal operation of the solid state storage device, the plurality of optimal reference voltages stored in each table entry among a plurality of candidate reference voltages resulting from the characterization test, the plurality of candidate reference voltages comprising, for each range pair associated a respective table entry:

first candidate reference voltages associated with said range pair associated with the respective table entry and indicative of the reference voltages at which the memory page with the respective numerical value of program/erase cycles and of retention times falling within said range pair associated with the respective table entry is successfully read during the characterization test, and second candidate reference voltages associated with a plurality of adjacent ranges being adjacent to said range pair associated with the respective table entry, the plurality of adjacent range pairs comprising:

at least one first adjacent range pair each one comprising a respective adjacent range of numerical values of program/erase cycles being adjacent, in the succession of ranges of numerical values of program/erase cycles, to the range of numerical values of program/erase cycles of said range pair associated with the respective table entry, and the range of numerical values of retention times of said range pair associated with the respective table entry, at least one second adjacent range pair each one comprising a respective adjacent range of numerical values of retention times being adjacent, in the succession of ranges of numerical values of retention times, to the range of numerical values of retention times of said range pair associated with the respective table entry, and the range of numerical values of program/erase cycles of said range pair associated with the respective table entry, and at least one third adjacent range pair each one comprising a respective adjacent range of numerical values of program/erase cycles being adjacent to the range of numerical values of program/erase cycles of said range pair associated with the respective table entry and a respective adjacent range of numerical values of retention times being adjacent to the range of numerical values of retention times of said range pair associated with the respective table entry, the second candidate reference voltages associated with each adjacent range pair being indicative of the reference voltages at which the memory page with the respective numerical value of program/erase cycles and of retention times falling within the adjacent range pair is successfully read during the characterization test, and wherein each optimal reference voltage stored in each table entry comprises, as a result of said selection process, a respective one of the first candidate reference voltages or a respective one of the second candidate reference voltages.

26. The method according to claim 25, wherein, for each range pair associated with a respective table entry, the plurality of candidate reference voltages comprise a plurality of groups of candidate reference voltages, each group of candidate reference voltages comprising:

the first candidate reference voltages associated with said range pair associated with the respective table entry, and the second candidate reference voltages associated with a respective number of said at least one first adjacent range pair, of said least one second adjacent range pair and of said at least one third adjacent range pair according to a respective adjacency criterion, designating a number of groups of candidate reference voltages among the plurality of groups of candidate reference voltages, and selecting the plurality of optimal reference voltages to be stored in each table entry from the first and second candidate reference voltages of said number of designated groups of candidate reference voltages.

27. The method according to claim 26, wherein, for each range pair associated with a respective table entry, the number of designated groups of candidate reference voltages comprise the groups of candidate reference voltages in which the respective first and second candidate reference voltages have resulted, during the characterization test, in a number of read errors lower than a threshold number of read errors.

28. The method according to claim 27, wherein each designated group of candidate reference voltages comprises a respective worst range pair, among the range pair associated with the respective table entry and the respective adjacent range pairs, having the fewest associated candidate reference voltages that have resulted in a number of read errors lower than said threshold number of read errors, the method comprising:

electing a designated group of candidate reference voltages as the designated group of candidate reference voltages, among said number of designated groups of candidate reference voltages, in which the respective reference voltages that have resulted in a number of read errors lower than said threshold number of read errors, for the worst range pair, are in the highest percentage, wherein the number of read errors is obtained during the characterization test, and selecting the optimal reference voltages among the first and second candidate reference voltages of the elected designated group of candidate reference voltages.

29. The method according to claim 26, wherein each group of candidate reference voltages is further associated with a respective one of a plurality of test conditions under which the characterization test of the solid state storage device has been performed.

30. The method according to claim 29, wherein the plurality of test conditions comprise a plurality of temperatures.

31. The method according to claim 26, wherein each group of candidate reference voltages is further associated with a respective one of a plurality of selection criteria for selecting the optimal reference voltages among the plurality of candidate reference voltages.

32. The method according to claim 31, wherein the plurality of selection criteria comprise:
- a first selection criterion wherein, for each range pair associated with a respective table entry, the optimal reference voltages comprise the candidate reference voltages, among the respective first and second candidate reference voltages, which have the lowest second-worst number of read errors;
- a second selection criterion wherein, for each range pair associated with a respective table entry, the optimal reference voltages comprise the candidate reference voltages, among the respective first and second candidate reference voltages, which have the number of read errors with the lowest median.

33. The method according to claim 25, wherein the at least one table comprises a first and a second tables, wherein the plurality of optimal reference voltages stored in the first table are indicative of the reference voltages to be used during the read operation of the memory page responsive to a number of read disturb cycles affecting the memory page being above a threshold number of read disturb cycles, and the plurality of optimal reference voltages stored in the second table are indicative of the reference voltages to be used during the read operation of the memory page responsive to the number of read disturb cycles affecting the memory page being below the threshold number of read disturb cycles.

34. The method according to claim 28, comprising storing an additional table associated with the memory page, the additional table comprising a plurality of additional table entries associated with said range pairs associated with the respective table entries and a plurality of additional optimal reference voltages within the additional table entries, the additional optimal reference voltages within each additional table entry being indicative of the reference voltages to be used, in the normal operation of the solid state storage device, during the read operation of the memory page responsive to the current value of program/erase cycles and of retention times of the memory page falling within the respective range pair, each additional optimal reference voltage stored in each additional table entry being used during the read operation for discriminating a respective pair of adjacent bit patterns different from any other pair of adjacent bit patterns discriminated by the remaining additional optimal reference voltages stored in the additional table entry;

wherein the method comprises:
- electing an additional designated group of candidate reference voltages as the designated group of candidate reference voltages, among said number of designated groups of candidate reference voltages, in which the respective candidate reference voltages having resulted in a number of read errors lower than said threshold number of read errors during the characterization test are in a lower percentage than the said highest percentage, and
- selecting the additional optimal reference voltages among the first and second candidate reference voltages of the additional elected designated group of candidate reference voltages.

35. The method according to claim 25, comprising, after a request for carrying out the read operation of the memory page:
- determining a current numerical value of program/erase cycles and of retention times of the memory page;
- identifying the range pair to which the current numerical value of program/erase cycles and of retention times belong, and
- performing a hard read operation based on the optimal reference voltages stored in the table entry associated with the identified range pair.

36. The method according to claim 34, comprising, after a request for carrying out the read operation of the memory page:
- determining a current numerical value of program/erase cycles and of retention times of the memory page;
- identifying the range pair to which the current numerical value of program/erase cycles and of retention times belong;
- performing a hard read operation based on the optimal reference voltages stored in the table entry associated with the identified range pair, and
- in case of unsuccessful hard read operation, performing a hard read operation based on the additional optimal reference voltages stored in the additional table entry associated with the identified range pair.

* * * * *